US012598914B2

(12) United States Patent
Lee et al.

(10) Patent No.: US 12,598,914 B2
(45) Date of Patent: Apr. 7, 2026

(54) ORGANIC LIGHT EMITTING DIODE AND ORGANIC LIGHT EMITTING DEVICE INCLUDING THE SAME

(71) Applicant: LG DISPLAY CO., LTD., Seoul (KR)

(72) Inventors: Ji-Ae Lee, Paju-si (KR); Jun-Yun Kim, Paju-si (KR); Tae-Ryang Hong, Paju-si (KR); Jeong-Eun Baek, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 428 days.

(21) Appl. No.: 17/060,520

(22) Filed: Oct. 1, 2020

(65) Prior Publication Data

US 2021/0119140 A1 Apr. 22, 2021

(30) Foreign Application Priority Data

Oct. 18, 2019 (KR) ........................ 10-2019-0129775
Sep. 7, 2020 (KR) ........................ 10-2020-0113952

(51) Int. Cl.
*H10K 85/60* (2023.01)
*C09K 11/06* (2006.01)
(Continued)

(52) U.S. Cl.
CPC .......... *H10K 85/6572* (2023.02); *C09K 11/06* (2013.01); *H10K 85/322* (2023.02);
(Continued)

(58) Field of Classification Search
None
See application file for complete search history.

(56) References Cited

U.S. PATENT DOCUMENTS

2007/0001587 A1* 1/2007 Hatwar ......................... 313/504
2016/0190469 A1 6/2016 Ogiwara et al.
(Continued)

FOREIGN PATENT DOCUMENTS

CN 105684180 A 6/2016
KR 10-2018-0035528 A 4/2018
(Continued)

OTHER PUBLICATIONS

Ramanaskanda Braveenth et al. "Triazine-Acceptor-Based Green Thermally Activated Delayed Fluorescence Materials for Organic Light-Emitting Diodes", Materials 2019, vol. 12, p. 2646-1 to -19), Aug. 20, 2019 (Year: 2019).*
(Continued)

*Primary Examiner* — Seokmin Jeon
(74) *Attorney, Agent, or Firm* — Morgan, Lewis & Bockius LLP

(57) ABSTRACT

An organic light emitting diode (OLED) including at least one emitting material layer (EML) disposed two electrodes and comprising triazine-based delayed fluorescent material and boron-dipyrromethene-based fluorescent material and an organic light emitting device including the OLED is disclosed. The triazine-based delayed fluorescent material and the boron-dipyrromethene-based fluorescent material may be included in an identical EML or in adjacently disposed EMLs. The OLED can lower its driving voltage and improve its luminous efficiency by adjusting energy levels of the delayed fluorescent material and the fluorescent material.

26 Claims, 15 Drawing Sheets

(51) Int. Cl.
*H10K 50/11* (2023.01)
*H10K 85/30* (2023.01)

(52) U.S. Cl.
CPC ......... *H10K 85/654* (2023.02); *H10K 85/657* (2023.02); *C09K 2211/1055* (2013.01); *C09K 2211/107* (2013.01); *H10K 50/11* (2023.02)

(56) References Cited

U.S. PATENT DOCUMENTS

| | | | | |
|---|---|---|---|---|
| 2017/0352816 | A1* | 12/2017 | Jeon | H01L 51/0072 |
| 2018/0090705 | A1* | 3/2018 | Kim | H01L 51/5012 |
| 2018/0134686 | A1* | 5/2018 | Bergmann | C07D 403/10 |
| 2018/0175294 | A1* | 6/2018 | Duan | H01L 51/006 |
| 2018/0248127 | A1* | 8/2018 | Lee | H01L 51/0072 |
| 2018/0323395 | A1* | 11/2018 | Haldi | H01L 51/5024 |
| 2020/0083460 | A1* | 3/2020 | Duan | H01L 51/0072 |
| 2020/0127214 | A1 | 4/2020 | Choi et al. | |
| 2020/0251663 | A1* | 8/2020 | Choi | H01L 51/0072 |
| 2021/0135119 | A1* | 5/2021 | Cheng | H01L 51/0067 |
| 2021/0151683 | A1* | 5/2021 | Sakaino | H01L 51/008 |
| 2022/0285621 | A1 | 9/2022 | Thirion et al. | |

FOREIGN PATENT DOCUMENTS

| | | | |
|---|---|---|---|
| KR | 10-2018-0048412 | A | 5/2018 |
| KR | 10-2018-0098809 | A | 9/2018 |
| KR | 10-2020-0045292 | A | 5/2020 |
| WO | 2019013063 | A1 | 1/2019 |
| WO | 2021014023 | A1 | 1/2021 |

OTHER PUBLICATIONS

English translation of KR 2012/0054154 A and the original KR 2012/0054154 A, JungHwang Park (Year: 2012).*

Dan Tian et al. "Domino-like multi-emissions across red and near infrared from solid-state 2-/2,6-aryl substituted BODIPY dyes", Nature Comm. 2018, vol. 9, p. 2688-1 to -98 (Year: 2018).*

Panpan Wu et al. "Novel hole transport materials based on triarylamine/naphtho[2, 1-b] benzofunan for efficient green electroluminescent device", Tetrahedron, 2017, vol. 73, p. 4610-4615 (Year: 2017).*

English translation of KR 2016/0055375 A and the original KR 2016/0055375 A, Kang, Ji-Soung, May 18, 2016 (Year: 2016).*

Search Report dated Aug. 30, 2022, issued in corresponding German Patent Application No. 102020126635.9.

First Office Action dated Jul. 20, 2023, issued in corresponding Chinese Intellectual Property Office for CN App No. 202011072291.7.

Office Action issued Mar. 5, 2024 for Chinese Patent Application No. 202011072291.7 (See English Translation) (Note: US 2017/0352816 A1, CN 105684180 A & US 2018/0248127 A1 are of record.).

Office Action dated Feb. 6, 2025 issued in the corresponding Korean Patent Application No. 10-2020-0113952.

* cited by examiner

ORGANIC LIGHT EMITTING DIODE AND ORGANIC LIGHT EMITTING DEVICE INCLUDING THE SAME

CROSS-REFERENCE TO RELATED APPLICATIONS

This application claims the benefit under 35 U.S.C. § 119(a) to Korean Patent Application No. 10-2019-0129775, filed in the Republic of Korea on Oct. 18, 2019 and No. 10-2020-0113952, filed in the Republic of Korea on Sep. 7, 2020, the entire contents of which are incorporated herein by reference into the present application.

BACKGROUND

Technical Field

The present disclosure relates to an organic light emitting diode, and more specifically, to an organic light emitting diode having excellent luminous properties and an organic light emitting device having the diode.

Discussion of the Related Art

As display devices have become larger, there exists a need for a flat display device with lower spacing occupation. Among the flat display devices, a display device using an organic light emitting diode (OLED) has come into the spotlight.

In the OLED, when electrical charges are injected into an emitting material layer between an electron injection electrode (i.e., cathode) and a hole injection electrode (i.e., anode), electrical charges are recombined to form excitons, and then emit light as the recombined excitons are shifted to a stable ground state. The OLED can be formed as a thin film having a thickness less than 2000 Å and can be implement unidirectional or bidirectional images as electrode configurations. In addition, OLEDs can be formed on a flexible transparent substrate such as a plastic substrate so that OLED can implement a flexible or foldable display with ease. Moreover, the OLED can be driven at a lower voltage of 10 V or less. Besides, the OLED has relatively lower power consumption for driving compared to plasma display panels and inorganic electroluminescent devices, and the color purity of the OLED is very high. Particularly, the OLED can implement red, green and blue colors, thus it has attracted a lot of attention as a light emitting device.

Conventional fluorescent materials have shown low luminous efficiency because only the singlet excitons are involved in the luminescence process thereof. The phosphorescent materials in which triplet excitons as well as the singlet excitons are involved in the luminescence process have relatively high luminous efficiency compared to the fluorescent material. However, the metal complex as the representative phosphorescent material has too short luminous lifetime to be applicable into commercial devices.

SUMMARY

Accordingly, embodiments of the present disclosure are directed to an OLED and an organic light emitting device including the OLED that substantially obviates one or more of the problems due to the limitations and disadvantages of the related art.

An aspect of the present disclosure is to provide an OLED that can lower its driving voltage and enhance its luminous efficiency and lifetime and an organic light emitting device including the diode.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concept, as embodied and broadly described, an organic light emitting diode comprises: a first electrode; a second electrode facing the first electrode; and an emitting material layer disposed between the first and second electrodes, wherein the emitting material layer comprises a first compound, a second compound and a third compound, wherein the second compound comprises an organic compound having the following structure of Chemical Formula 1, and wherein the third compound comprises an organic compound having the following structure of Chemical Formula 3:

[Chemical Formula 1]

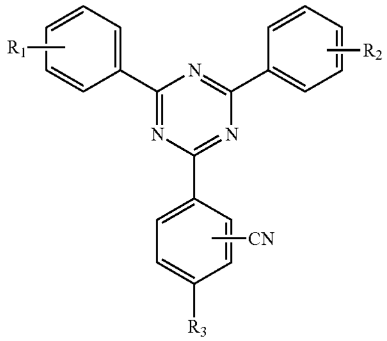

wherein each of $R_1$ and $R_2$ is independently hydrogen or an unsubstituted or substituted $C_1$-$C_{10}$ alkyl group; and $R_3$ is an unsubstituted or substituted $C_8$-$C_{30}$ fused hetero aromatic group, an unsubstituted or substituted $C_6$-$C_{30}$ aromatic amino group or an unsubstituted or substituted $C_3$-$C_{30}$ hetero aromatic amino group;

[Chemical Formula 3]

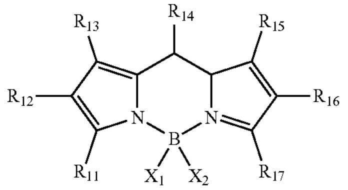

wherein each of $R_{11}$ to $R_{17}$ is independently hydrogen, an unsubstituted or substituted $C_1$-$C_{10}$ alkyl group, an unsubstituted or substituted $C_1$-$C_{10}$ alkoxy group, an unsubstituted or substituted $C_6$-$C_{30}$ aromatic group or an unsubstituted or substituted $C_3$-$C_{30}$ hetero aromatic group, or two adjacent groups among $R_1$ to $R_{17}$ forms an unsubstituted or substituted $C_6$-$C_{20}$ alicyclic ring, an unsubstituted or substituted $C_4$-$C_{20}$ hetero alicyclic ring, an unsubstituted o substituted $C_6$-$C_{20}$ aromatic ring or an unsubstituted or substituted $C_3$-$C_{20}$ hetero aromatic ring; and each of $X_1$ and $X_2$ is independently a halogen atom.

In another aspect, an organic light emitting diode comprises: a first electrode; a second electrode facing the first electrode; a first emitting material layer disposed between the first and second electrodes; and a second emitting material layer disposed between the first electrode and the first emitting material layer or between the first emitting material layer and the second electrode, wherein the first emitting material layer comprises a first compound and a second compound, wherein the second emitting material layer comprises a fourth compound a fifth compound, wherein the second compound comprises an organic compound having the structure of Chemical Formula 1, and wherein the fifth compound comprises an organic compound having the structure of Chemical formula 3.

In still another aspect, an organic light emitting device comprises a substrate and the OLEDs disposed over the substrate, as described above.

It is to be understood that both the foregoing general description and the following detailed description are exemplary and explanatory and are intended to provide further explanation of the inventive concepts as claimed.

BRIEF DESCRIPTION OF THE DRAWING

The accompanying drawings, which are included to provide a further understanding of the disclosure, are incorporated in and constitute a part of this application, illustrate embodiments of the disclosure and together with the description serve to explain principles of the disclosure.

DETAILED DESCRIPTION

Reference and discussions will now be made below in detail to aspects, embodiments and examples of the disclosure, some examples of which are illustrated in the accompanying drawings.

The present disclosure relates to an organic light emitting diode (OLED) into which delayed fluorescent material and fluorescent material having adjusted energy levels are applied in an identical EML or adjacently disposed EMLs and an organic light emitting device having the OLED. The OLED may be applied into an organic light emitting device such as an organic light emitting display device and an organic light emitting luminescent device. As an example, a display device applying the OLED will be described.

Figure 1:
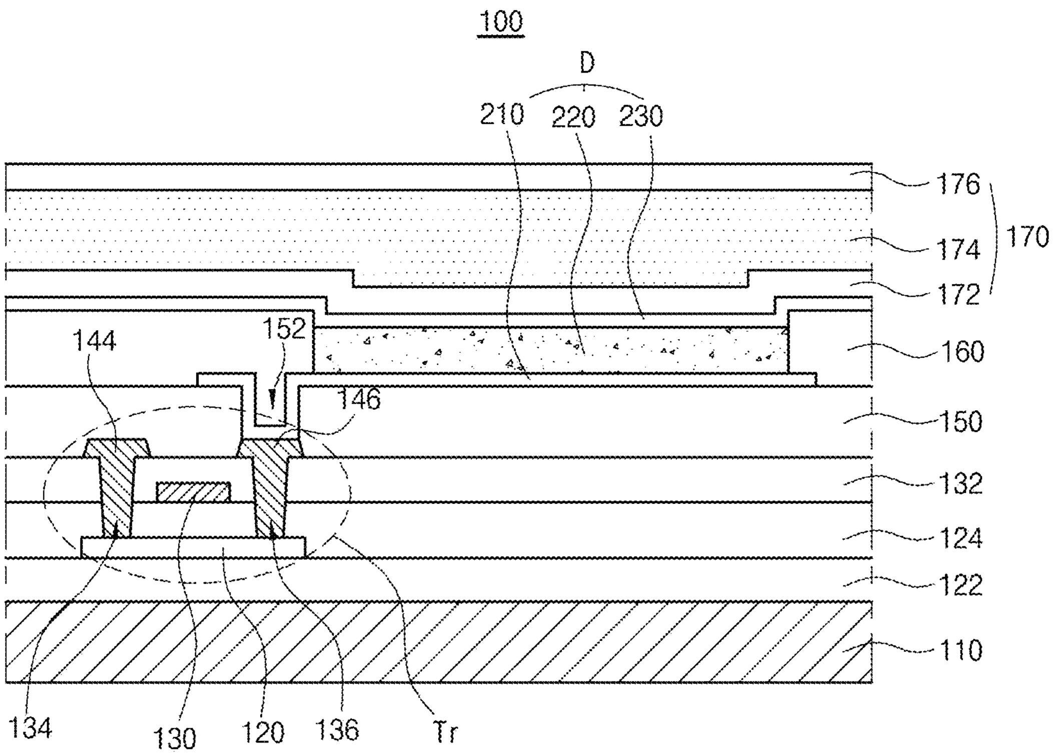
FIG. 1 is a schematic cross-sectional view illustrating an organic light emitting display device in accordance with an exemplary aspect of the present disclosure.

FIG. 1 is a schematic cross-sectional view of an organic light emitting display device 100 in accordance with an exemplary aspect of the present disclosure. All components of the organic light emitting device in accordance with all aspects of the present disclosure are operatively coupled and configured. As illustrated in FIG. 1, the organic light emitting display device 100 includes a substrate 110, a thin-film transistor Tr on the substrate 110, and an organic light emitting diode (OLED) D connected to the thin film transistor Tr.

The substrate 110 may include, but is not limited to, glass, thin flexible material and/or polymer plastics. For example, the flexible material may be selected from the group, but is not limited to, polyimide (PI), polyethersulfone (PES), polyethylenenaphthalate (PEN), polyethylene terephthalate (PET), polycarbonate (PC) and combination thereof. The substrate 110, over which the thin film transistor Tr and the OLED D are arranged, form an array substrate.

A buffer layer 122 may be disposed over the substrate 110, and the thin film transistor Tr is disposed over the buffer layer 122. The buffer layer 122 may be omitted.

A semiconductor layer 120 is disposed over the buffer layer 122. In one exemplary aspect, the semiconductor layer 120 may include, but is not limited to, oxide semiconductor materials. In this case, a light-shield pattern may be disposed under the semiconductor layer 120, and the light-shield pattern can prevent light from being incident toward the semiconductor layer 120, and thereby, preventing the semiconductor layer 120 from being deteriorated by the light. Alternatively, the semiconductor layer 120 may include, but is not limited to, polycrystalline silicon. In this case, opposite edges of the semiconductor layer 120 may be doped with impurities.

A gate insulating layer 124 formed of an insulating material is disposed on the semiconductor layer 120. The gate insulating layer 124 may include, but is not limited to, an inorganic insulating material such as silicon oxide ($SiO_x$) or silicon nitride ($SiN_x$).

A gate electrode 130 made of a conductive material such as a metal is disposed over the gate insulating layer 124 so as to correspond to a center of the semiconductor layer 120. While the gate insulating layer 124 is disposed over a whole area of the substrate 110 in FIG. 1, the gate insulating layer 124 may be patterned identically as the gate electrode 130.

An interlayer insulating layer 132 formed of an insulating material is disposed on the gate electrode 130 with covering over an entire surface of the substrate 110. The interlayer insulating layer 132 may include, but is not limited to, an inorganic insulating material such as silicon oxide ($SiO_x$) or silicon nitride ($SiN_x$), or an organic insulating material such as benzocyclobutene or photo-acryl.

The interlayer insulating layer 132 has first and second semiconductor layer contact holes 134 and 136 that expose both sides of the semiconductor layer 120. The first and second semiconductor layer contact holes 134 and 136 are disposed over opposite sides of the gate electrode 130 with spacing apart from the gate electrode 130. The first and second semiconductor layer contact holes 134 and 136 are formed within the gate insulating layer 124 in FIG. 1. Alternatively, the first and second semiconductor layer contact holes 134 and 136 are formed only within the interlayer insulating layer 132 when the gate insulating layer 124 is patterned identically as the gate electrode 130.

A source electrode 144 and a drain electrode 146, which are formed of conductive material such as a metal, are disposed on the interlayer insulating layer 132. The source electrode 144 and the drain electrode 146 are spaced apart from each other with respect to the gate electrode 130, and contact both sides of the semiconductor layer 120 through the first and second semiconductor layer contact holes 134 and 136, respectively.

The semiconductor layer 120, the gate electrode 130, the source electrode 144 and the drain electrode 146 constitute the thin film transistor Tr, which acts as a driving element. The thin film transistor Tr in FIG. 1 has a coplanar structure in which the gate electrode 130, the source electrode 144 and the drain electrode 146 are disposed over the semiconductor layer 120. Alternatively, the thin film transistor Tr may have an inverted staggered structure in which a gate electrode is disposed under a semiconductor layer and a source and drain electrodes are disposed over the semiconductor layer. In this case, the semiconductor layer may comprise amorphous silicon.

A gate line and a data line, which cross each other to define a pixel region, and a switching element, which is connected to the gate line and the data line, may be further formed in the pixel region of FIG. 1. The switching element is connected to the thin film transistor Tr, which is a driving element. Besides, a power line is spaced apart in parallel from the gate line or the data line, and the thin film transistor Tr may further include a storage capacitor configured to constantly keep a voltage of the gate electrode for one frame.

In addition, the organic light emitting display device 100 may include a color filter that comprises dyes or pigments for transmitting specific wavelength light of light emitted from the OLED D. For example, the color filter can transmit light of specific wavelength such as red (R), green (G), blue (B) and/or white (W). Each of red, green, and blue color filter may be formed separately in each pixel region. In this case, the organic light emitting display device 100 can implement full-color through the color filter.

For example, when the organic light emitting display device 100 is a bottom-emission type, the color filter may be disposed on the interlayer insulating layer 132 with corresponding to the OLED D. Alternatively, when the organic light emitting display device 100 is a top-emission type, the color filter may be disposed over the OLED D, that is, a second electrode 230.

A passivation layer 150 is disposed on the source and drain electrodes 144 and 146 over the whole substrate 110. The passivation layer 150 has a flat top surface and a drain contact hole 152 that exposes the drain electrode 146 of the thin film transistor Tr. While the drain contact hole 152 is disposed on the second semiconductor layer contact hole 136, it may be spaced apart from the second semiconductor layer contact hole 136.

The OLED D includes a first electrode 210 that is disposed on the passivation layer 150 and connected to the drain electrode 146 of the thin film transistor Tr. The OLED D further includes an emissive layer 220 and a second electrode 230 each of which is disposed sequentially on the first electrode 210.

The first electrode 210 is disposed in each pixel region. The first electrode 210 may be an anode and include a conductive material having a relatively high work function value. For example, the first electrode 210 may include, but is not limited to, a transparent conductive material such as indium tin oxide (ITO), indium zinc oxide (IZO), indium tin zinc oxide (ITZO), tin oxide (SnO), zinc oxide (ZnO), indium cerium oxide (ICO), aluminum doped zinc oxide (AZO), and the like.

In one exemplary aspect, when the organic light emitting display device 100 is a bottom-emission type, the first electrode 210 may have a single-layered structure of a transparent conductive material. Alternatively, when the organic light emitting display device 100 is a top-emission type, a reflective electrode or a reflective layer may be disposed under the first electrode 210. For example, the reflective electrode or the reflective layer may include, but are not limited to, silver (Ag) or aluminum-palladium-copper (APC) alloy. In the OLED D of the top-emission type, the first electrode 210 may have a triple-layered structure of ITO/Ag/ITO or ITO/APC/ITO. In addition, a bank layer 160 is disposed on the passivation layer 150 in order to cover edges of the first electrode 210. The bank layer 160 exposes a center of the first electrode 210.

An emissive layer 220 is disposed on the first electrode 210. In one exemplary aspect, the emissive layer 220 may have a single-layered structure of an emitting material layer (EML). Alternatively, the emissive layer 220 may have a multiple-layered structure of a hole injection layer (HIL), a hole transport layer (HTL), an electron blocking layer (EBL), an EML, a hole blocking layer (HBL), an electron transport layer (ETL) and/or an electron injection layer (EIL) (see, FIGS. 2, 6, 8 and 10). In one aspect, the emissive layer 220 may have one emitting part. Alternatively, the emissive layer 220 may have multiple emitting parts to form a tandem structure.

The second electrode 230 is disposed over the substrate 110 above which the emissive layer 220 is disposed. The second electrode 230 may be disposed over a whole display area and may include a conductive material with a relatively low work function value compared to the first electrode 210. The second electrode 230 may be a cathode. For example, the second electrode 230 may include, but is not limited to, aluminum (Al), magnesium (Mg), calcium (Ca), silver (Ag), alloy thereof or combination thereof such as aluminum-magnesium alloy (Al—Mg). When the organic light emitting display device 100 is a top-emission type, the second electrode 230 is thin so as to have light-transmissive (semi-transmissive) property.

In addition, an encapsulation film 170 may be disposed over the second electrode 230 in order to prevent outer moisture from penetrating into the OLED D. The encapsulation film 170 may have, but is not limited to, a laminated structure of a first inorganic insulating film 172, an organic insulating film 174 and a second inorganic insulating film 176.

Moreover, the organic light emitting display device 100 may have a polarizer in order to decrease external light reflection. For example, the polarizer may be a circular polarizer. When the organic light emitting display device 100 is a bottom-emission type, the polarizer may be disposed under the substrate 100. Alternatively, when the organic light emitting display device 100 is a top-emission type, the polarizer may be disposed over the encapsulation film 170. In addition, a cover window may be attached to the encapsulation film 170 or the polarizer. In this case, the substrate 110 and the cover window may have a flexible property, thus the organic light emitting display device 100 may be a flexible display device.

Figure 2:
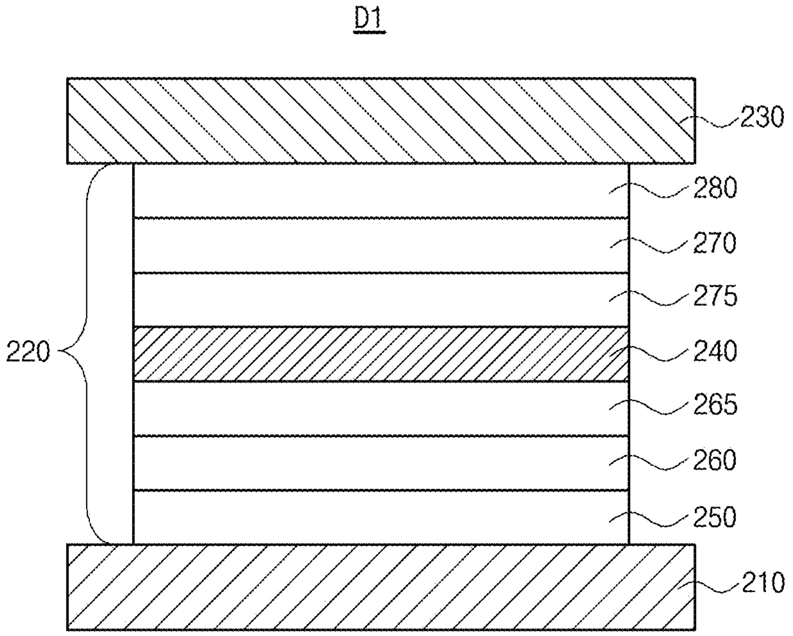
FIG. 2 is a schematic cross-sectional view illustrating an OLED in accordance with an exemplary aspect of the present disclosure.

Now, we will describe the OLED in more detail. FIG. 2 is a schematic cross-sectional view illustrating an OLED in accordance with an exemplary aspect of the present disclosure. As illustrated in FIG. 2, the OLED D1 comprises first and second electrodes 210 and 230 facing each other, and an emissive layer 220 having single emitting part disposed between the first and second electrodes 210 and 230. The organic light emitting display device 100 includes a red pixel region, a green pixel region and a blue pixel region, and the OLED D1 may be disposed in the green pixel region. The emissive layer 220 comprises an EML 240 disposed between the first and second electrodes 210 and 230. Also, the emissive layer 220 may comprise at least one of a HTL 260 disposed between the first electrode 210 and the EML 240 and an ETL 270 disposed between the second electrode 230 and the EML 240. Also, the emissive layer 220 may further comprise at least one of a HIL 250 disposed between the first electrode 210 and the HTL 260 and an EIL 280 disposed between the second electrode 230 and the ETL 270. Alternatively, the emissive layer 220 may further comprise a first exciton blocking layer, i.e. an EBL 265 disposed between the HTL 260 and the EML 240 and/or a second exciton blocking layer, i.e. a HBL 275 disposed between the EML 240 and the ETL 270.

The first electrode 210 may be an anode that provides a hole into the EML 240. The first electrode 210 may include, but is not limited to, a conductive material having a relatively high work function value, for example, a transparent conductive oxide (TCO). In an exemplary aspect, the first electrode 210 may include, but is not limited to, ITO, IZO, ITZO, SnO, ZnO, ICO, AZO, and the like.

The second electrode 230 may be a cathode that provides an electron into the EML 240. The second electrode 230 may include, but is not limited to, a conductive material having a relatively low work function values, i.e., a highly reflective material such as Al, Mg, Ca, Ag, alloy thereof, combination thereof, and the like.

The EML 240 may comprise a first compound (Compound 1, Host) H, a second compound (Compound 2, dopant 1) DF and a third compound (Compound 3, dopant 2) FD. For example, the first compound H may be a (first) host, the second compound DF may be a delayed fluorescent material DF, and the third compound FD may be a fluorescent material. The first compound H in the EML 240 may comprise, but is not limited to, 9-(3-(9H-carbazol-9-yl)phenyl)-9H-carbazole-3-carbonitrile (mCP-CN), 4,4'-bis(N-carbazolyl)-1,1'-biphenyl (CBP), 3,3'-bis(N-carbazolyl)-1,1'-biphenyl (mCBP), 1,3-Bis(carbazol-9-yl)benzene (mCP), Bis[2-(diphenylphosphino)phenyl] ether oxide (DPEPO), 2,8-bis(diphenylphosphoryl)dibenzothiophene (PPT), 1,3,5-Tri[(3-pyridyl)-phen-3-yl]benzene (TmPyPB), 2,6-Di(9H-carbazol-9-yl)pyridine (PYD-2Cz), 2,8-di(9H-carbazol-9-yl)dibenzothiophene (DCzDBT), 3',5'-Di(carbazol-9-yl)-[1,1'-bipheyl]-3,5-dicarbonitrile (DCzTPA), 4'-(9H-carbazol-9-yl)biphenyl-3,5-dicarbonitrile(4'-(9H-carbazol-9-yl)biphenyl-3,5-dicarbonitrile (pCzB-2CN), 3'-(9H-carbazol-9-yl)biphenyl-3,5-dicarbonitrile (mCzB-2CN), Diphenyl-4-triphenylsilylphenyl-phosphine oxide (TSPO1), 9-(9-phenyl-9H-carbazol-6-yl)-9H-carbazole (CCP), 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole and/or 9-(6-(9H-carbazol-9-yl)pyridin-3-yl)-9H-3,9'-bicabazole).

The EML 240 comprises the second compound DF that is delayed fluorescent material. When holes and electrons meet to form exciton, singlet exciton with a paired spin state and triplet exciton with an unpaired spin state is generated in a ratio of 1:3 in theory. Since the conventional fluorescent materials can utilize only the singlet excitons, they exhibit low luminous efficiency. The phosphorescent materials can utilize the triplet excitons as well as the singlet excitons, while they show too short luminous lifetime to be applicable to commercial devices.

Delayed fluorescent material such as such as a thermally-activated delayed fluorescent (TADF) material, which can solve the problems accompanied by the conventional art fluorescent and/or phosphorescent materials, has been developed. The delayed fluorescent materials DF have very narrow energy bandgap $\Delta E_{ST}^{DF}$ between an excited singlet energy level $S_1^{DF}$ and an excited triplet energy level $T_1^{DF}$ (see, FIG. 3). Accordingly, the excitons of singlet energy level $S_1^{DF}$ as well as the excitons of triplet energy level $T_1^{DF}$ in the delayed fluorescent material DF can be transferred to an intermediate energy level state, i.e. ICT state, and then the intermediate stated excitons can be shifted to a ground state ($S_0^{DF}$; $S_1^{DF} \rightarrow ICT \leftarrow T_1^{DF}$).

Since the delayed fluorescent material DF has the electron acceptor moiety spacing apart from the electron donor moiety within the molecule, it exists as a polarized state having a large dipole moment within the molecule. As the interaction between HOMO and LUMO becomes little in the state where the dipole moment is polarized, the triplet excitons as well as the singlet excitons can be converted to ICT state.

The delayed fluorescent material DF must has an energy level bandgap $\Delta E_{ST}^{DF}$ equal to or less than about 0.3 eV, for example, from about 0.05 to about 0.3 eV, between the excited singlet energy level $S_1^{DF}$ and the excited triplet energy level $T_1^{DF}$ so that exciton energy in both the excited singlet energy level $S_1^{DF}$ and the excited triplet energy level $T_1^{DF}$ can be transferred to the ICT state. The material having little energy level bandgap $\Delta E_{ST}^{DF}$ between the singlet energy level $S_1^{DF}$ and the triplet energy level $T_1^{DF}$ can exhibit common fluorescence with Inter system Crossing (ISC) in which the excitons of singlet energy level $S_1^{DF}$ can be transferred to the excitons of triplet energy level $T_1^{DF}$, as well as delayed fluorescence with Reverser Inter System Crossing (RISC) in which the excitons of triplet energy level $T_1^{DF}$ can be transferred upwardly to the excitons of singlet energy level $S_1^{DF}$, and then the exciton of singlet energy level $S_1^{DF}$ transferred from the triplet energy level $T_1^{DF}$ can be transferred to the ground state $S_0^{DF}$. In other words, 25% excitons at the excited singlet energy level $S_1^{DF}$ and 75% excitons at the excited triplet energy level $T_1^{DF}$ of the delayed fluorescent materials DF are converted to ICT state, and then the converted excitons drops to the ground state $S_0$ with luminescence. Therefore, the delayed fluorescent material may have 100% internal quantum efficiency in theory.

The second compound as the delayed fluorescent material in the EML 240 may be a triazine-based delayed fluorescent material. The triazine-based delayed fluorescent material that can be used as the second compound DF in the EML 240 may have the following structure of Chemical Formula 1:

[Chemical Formula 1]

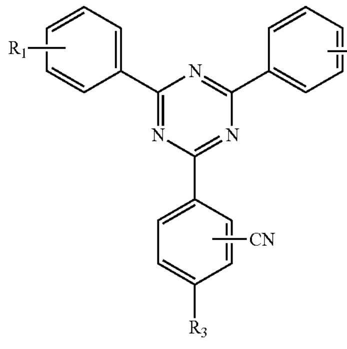

In Chemical Formula 1, each of $R_1$ and $R_2$ is independently hydrogen or an unsubstituted or substituted $C_1$-$C_{10}$ alkyl group; and $R_3$ is an unsubstituted or substituted $C_8$-$C_{30}$ fused hetero aromatic group, an unsubstituted or substituted $C_6$-$C_{30}$ aromatic amino group or an unsubstituted or substituted $C_3$-$C_{30}$ hetero aromatic amino group.

As used herein, the term 'unsubstituted" means that hydrogen is linked, and in this case, hydrogen comprises protium, deuterium and tritium.

As used herein, the substituent in the term "substituted" comprises, but is not limited to, unsubstituted or halogen-substituted $C_1$-$C_{20}$ alkyl, unsubstituted or halogen-substituted $C_1$-$C_{20}$ alkoxy, halogen, cyano, —$CF_3$, a hydroxyl group, a carboxylic group, a carbonyl group, an amino group, a $C_1$-$C_{10}$ alkyl amino group, a $C_6$-$C_{30}$ aryl amino group, a $C_3$-$C_{30}$ hetero aryl amino group, a $C_6$-$C_{30}$ aryl group, a $C_3$-$C_{30}$ hetero aryl group, a nitro group, a hydrazyl group, a sulfonate group, a $C_1$-$C_{20}$ alkyl silyl group, a $C_6$-$C_{30}$ aryl silyl group and a $C_3$-$C_{30}$ hetero aryl silyl group.

As used herein, the term 'hetero" in such as "a hetero aromatic ring", "a hetero cycloalkyene group", "a hetero arylene group", "a hetero aryl alkylene group", "a hetero aryl oxylene group", "a hetero cycloalkyl group", "a hetero aryl group", "a hetero aryl alkyl group", "a hetero aryloxyl group", "a hetero aryl amino group" means that at least one carbon atom, for example 1-5 carbons atoms, constituting an aromatic ring or an alicyclic ring is substituted at least one hetero atom selected from the group consisting of N, O, S, P and combination thereof.

As an example, each of the $C_8$-$C_{30}$ fused hetero aromatic group, the $C_6$-$C_{20}$ aromatic amino group and the $C_3$-$C_{20}$ hetero aromatic amino group may be unsubstituted or substituted with at least one group selected from a $C_1$-$C_{10}$ alkyl group, a $C_6$-$C_{30}$ aromatic group and a $C_3$-$C_{30}$ hetero aromatic group. As used herein, a $C_6$-$C_{30}$ aromatic group may comprise a $C_6$-$C_{30}$ aryl group, a $C_7$-$C_{30}$ aryl alkyl group, a $C_6$-$C_{30}$ aryloxyl group and a $C_6$-$C_{30}$ aryl amino group. As used herein, a $C_3$-$C_{30}$ hetero aromatic group may comprise a $C_3$-$C_{30}$ hetero aryl group, a $C_4$-$C_{30}$ hetero aryl alkyl group, a $C_3$-$C_{30}$ hetero aryloxyl group and a $C_3$-$C_{30}$ hetero aryl amino group.

In Chemical Formula 1, the triazine moiety functions as an electron acceptor and the fused hetero aromatic group or the (hetero) aromatic amino group as represented by $R_3$ functions as an electron donor. As an example, the fused hetero aromatic group defined in Chemical Formula 1 may comprise a carbazolyl moiety, an acridinyl moiety, a phenazinyl moiety and a phenoxazinyl moiety. Also, the fused hetero aromatic group may further comprise aromatic or hetero aromatic rings such as a benzene ring, a naphthalene ring, an indene ring, a pyridine ring, an indole ring, a furan ring, a benzo-furan ring, a dibenzo-furan ring, a thiophene ring, a benzo-thiophene ring and/or a dibenzo-thiophene ring fused to those moieties. For example, the fused hetero aromatic group may comprise an unsubstituted or substituted indolo-carbazolyl moiety, an unsubstituted or substituted benzo-thieno-carbazolyl moiety. For example, the triazine-based delayed fluorescent material having the structure of Chemical Formula 1 may comprise anyone having the following structure of Chemical Formula 2:

[Chemical Formula 2]

1-1

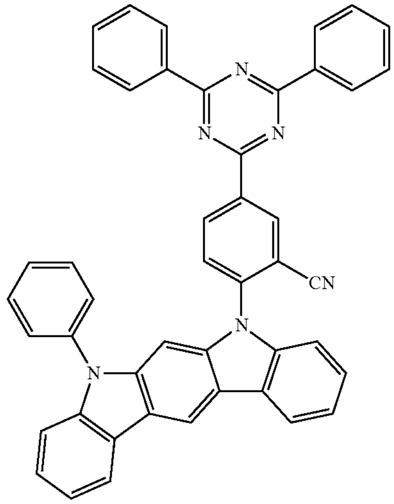

1-2

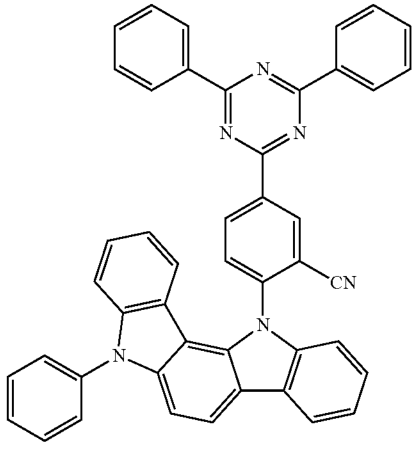

-continued
1-3
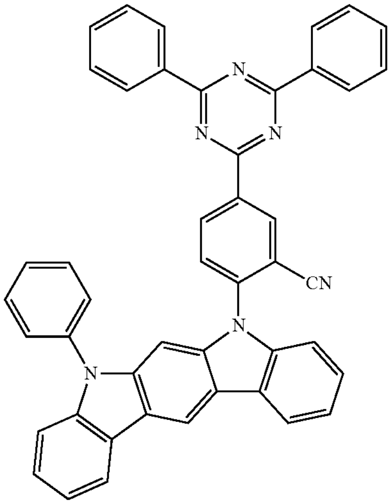
1-4
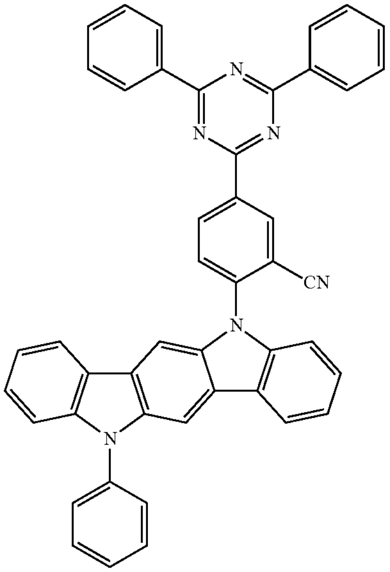
1-5
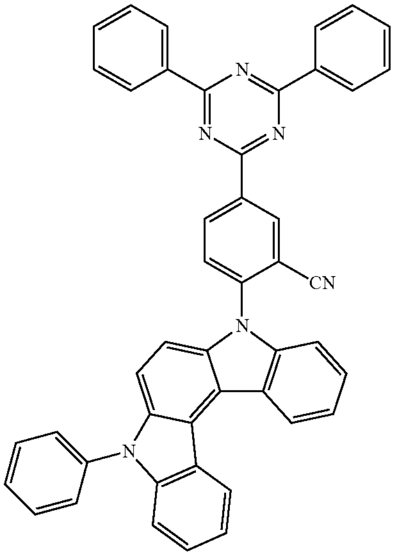
-continued
1-6
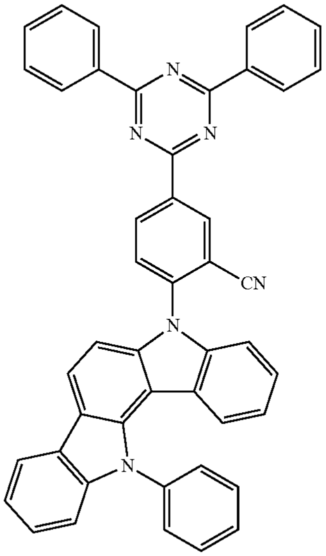
1-7
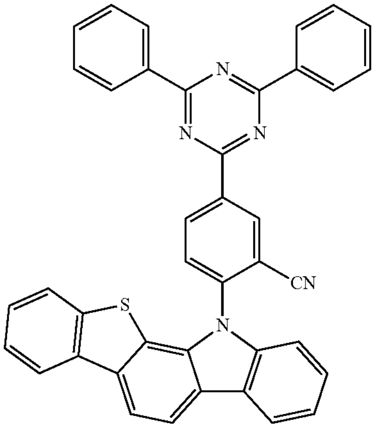
1-8
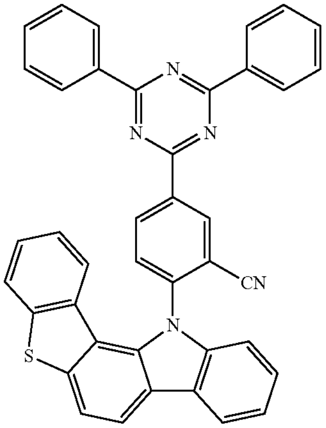

-continued
1-9
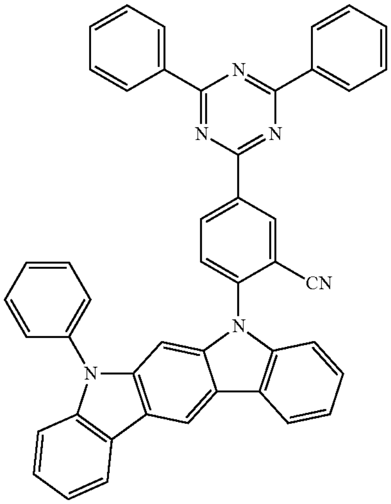
1-10
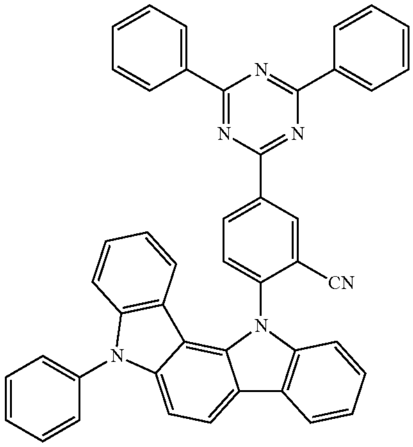
1-11
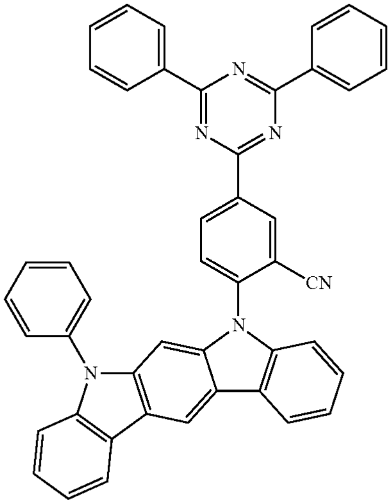
-continued
1-12
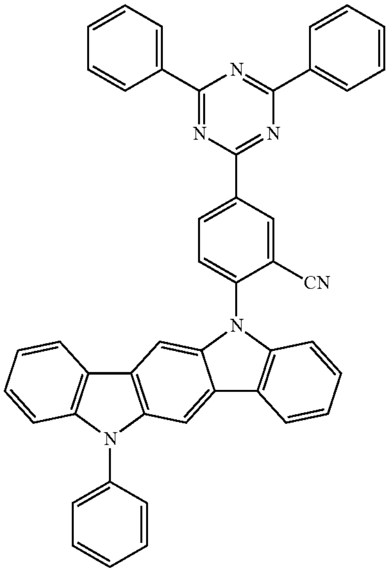
1-13
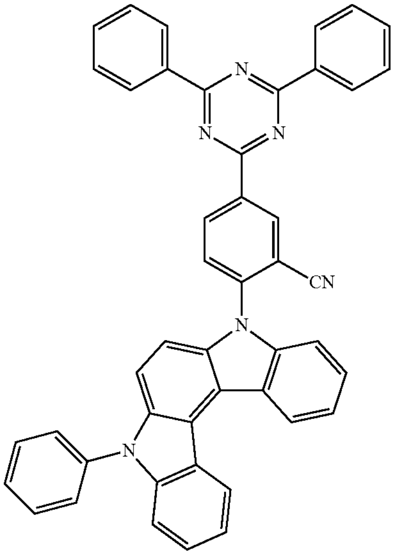

-continued
1-14
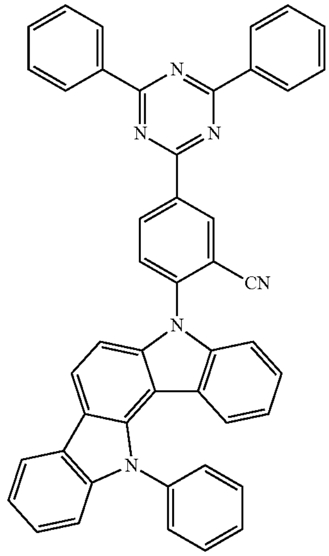
1-15
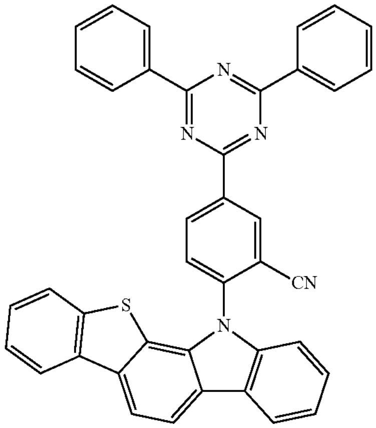
1-16
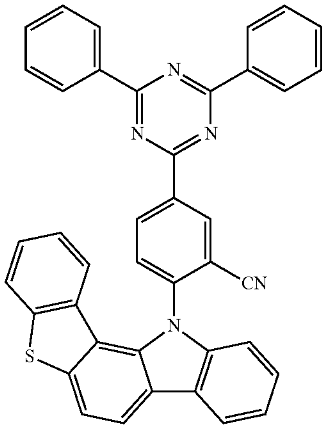
-continued
1-17
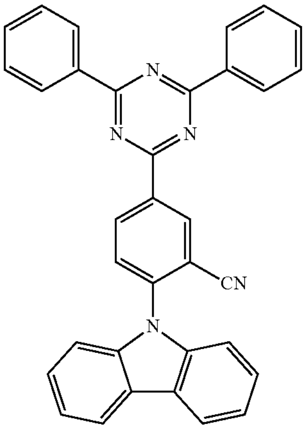
1-18
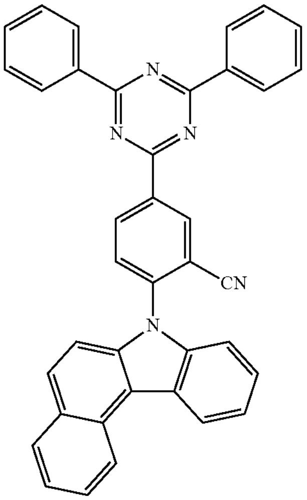
1-19
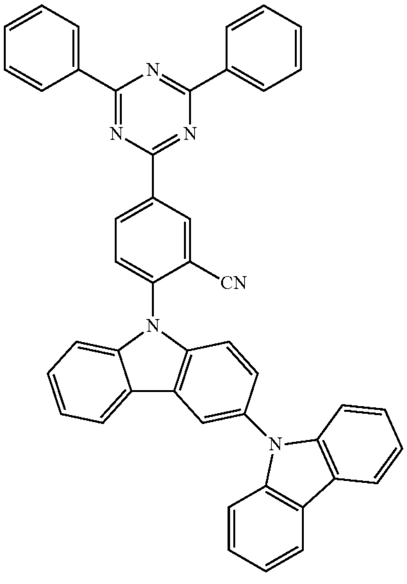

-continued 1-20

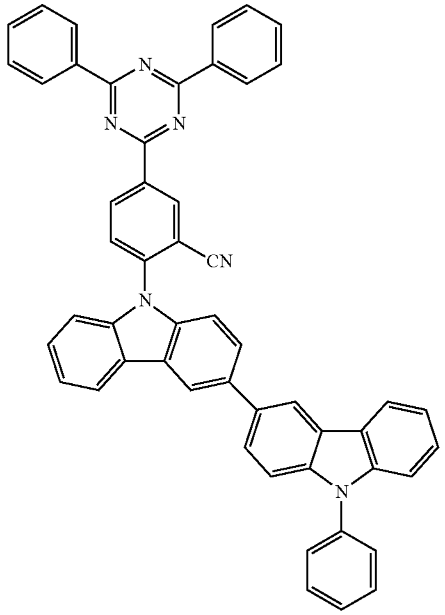

The second compound DF as the delayed fluorescent material has very narrow energy bandgap $\Delta E_{ST}^{DF}$ between an excited singlet energy level $S_1^{DF}$ and an excited triplet energy level $T_1^{DF}$ (see, FIG. 5) and has excellent quantum efficiency because the triplet exciton energy of the second compound DF can be converted to the singlet exciton energy by RISC mechanism. However, the second compound DF having the structure of Chemical Formulae 1 and 2 has a distorted chemical conformation owing to the electron acceptor moiety and the electron donor moiety and requires addition charge transfer transition (CT transition) because of utilizing triplet excitons. The second compound having the structure of Chemical Formulae 1 and 2 has very wide FWHM (full-width at half maximum) owing to the luminescence property caused by the CT luminous mechanism, thus its color purity is very limited.

The EML 240 includes the third compound as the fluorescent material in order to the limits caused by the delayed fluorescent material in order to implement hyper fluorescence. As described above, the second compound DF having the delayed fluorescent property can utilize the triplet exciton energy as well as the singlet exciton energy. When the EML 240 includes the third compound FD as the fluorescent material having proper energy levels compared to the second compound DF as the delayed fluorescent material, the exciton energy emitted from the delayed fluorescent material is absorbed by the fluorescent material, and then the exciton energy absorbed by the fluorescent material generates 100% singlet exciton with maximizing its luminous efficiency.

The singlet exciton energy of the second compound DF, which includes the singlet exciton energy of the second compound DF converted from the triplet exciton energy of the second compound DF as the delayed fluorescent material in the EML 240, is transferred to the third compound FD as the fluorescent material in the same EML 240 via Forster resonance energy transfer (FRET) mechanism, and the ultimate emission is occurred at the third compound. Any compound having an absorption spectrum widely overlapped with a photoluminescence spectrum of the second compound DF may be used as the third compound FD so that the exciton energy generated at the second compound DF may be efficiently transferred to the third compound FD. Since the third compound FD emits light with shifted from the excited state to the ground state, not CT luminous mechanism, its FWHM is relatively narrow, and thus can improve color purity.

The third compound in the EML 240 may be green fluorescent material. For example, the third compound in the EML 240 may be a fluorescent material having a boron-dipyrromethene (BODIPY) core. As an example, the third compound having the BODIPY core may have the following structure of Chemical Formula 3:

[Chemical Formula 3]

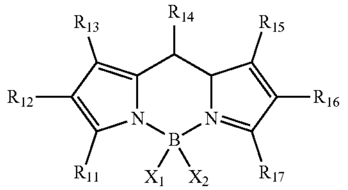

In Chemical Formula 3, each of $R_{11}$ to $R_{17}$ is independently hydrogen, an unsubstituted or substituted $C_1$-$C_{10}$ alkyl group, an unsubstituted or substituted $C_1$-$C_{10}$ alkoxy group, an unsubstituted or substituted $C_6$-$C_{30}$ aromatic group or an unsubstituted or substituted $C_3$-$C_{30}$ hetero aromatic group, or two adjacent groups among $R_{11}$ to $R_{17}$ forms an unsubstituted or substituted $C_6$-$C_{20}$ alicyclic ring, an unsubstituted or substituted $C_4$-$C_{20}$ hetero alicyclic ring, an unsubstituted or substituted $C_6$-$C_{20}$ aromatic ring or an unsubstituted or substituted $C_3$-$C_{20}$ hetero aromatic ring; and each of $X_1$ and $X_2$ is independently a halogen atom.

As an example, each of the $C_6$-$C_{30}$ aromatic group the $C_3$-$C_{30}$ hetero aromatic group in $R_{11}$ to $R_{17}$ may be independently unsubstituted or substituted with at least one group selected from a $C_1$-$C_{10}$ alkyl group, a $C_6$-$C_{30}$ aryl group and a $C_3$-$C_{30}$ hetero aryl group. Optionally, each of the $C_6$-$C_{30}$ aryl group and the $C_3$-$C_{30}$ hetero aryl group may be independently unsubstituted or further substituted with another $C_1$-$C_{10}$ alkyl group.

As an example, at least four groups among $R_{11}$ to $R_{13}$ and $R_{15}$ to $R_{17}$ in Chemical Formula 3 may be a $C_1$-$C_{10}$ alkyl group, and the rest of $R_{11}$ to $R_{13}$ and $R_{15}$ to $R_{17}$ may be a $C_6$-$C_{30}$ aryl group and/or a $C_3$-$C_{30}$ hetero aryl group. In addition, R14 in Chemical Formula 3 may be unsubstituted or may be a $C_1$-C10 alkyl group, a $C_6$-$C_{30}$ aryl group substituted with a $C_1$-$C_{10}$ alkyl group or a $C_6$-$C_{30}$ aryl group substituted with a $C_3$-$C_{30}$ hetero aryl group.

In one exemplary aspect, the third compound FD as the fluorescent material having the BODIPY core may comprise any organic compound having the following structure of Chemical Formula 4:

[Chemical Formula 4]

2-1

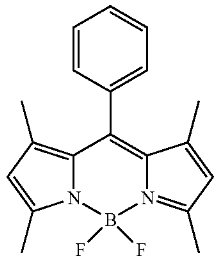

-continued
2-2
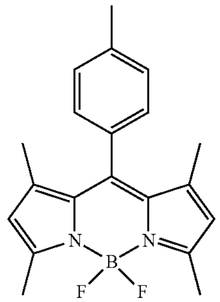
2-3
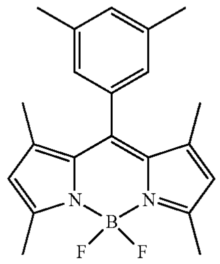
2-4
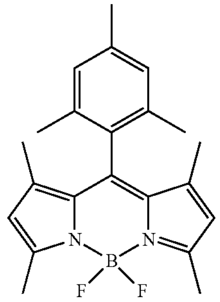
2-5
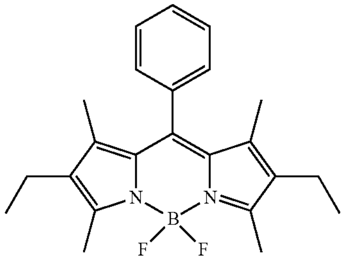
2-6
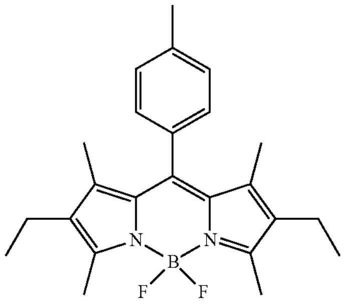
-continued
2-7
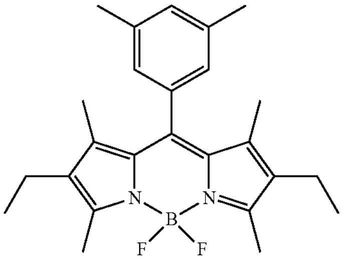
2-8
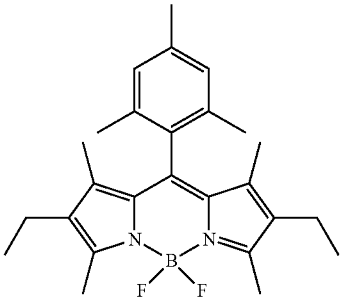
2-9
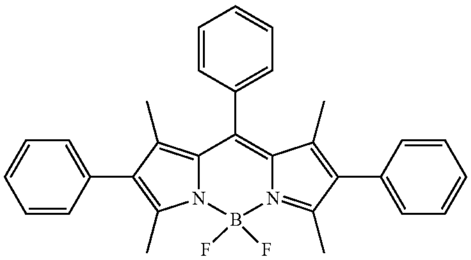
2-10
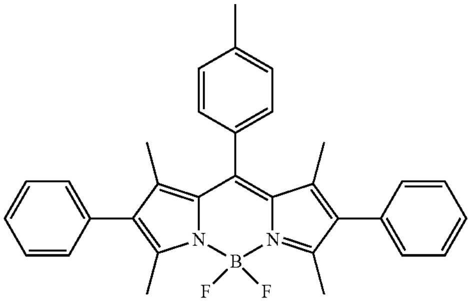
2-11
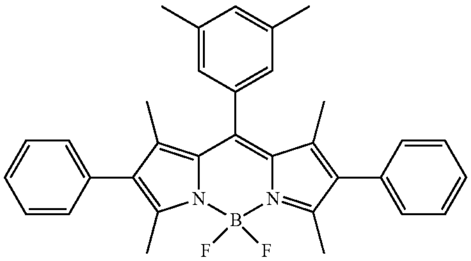

-continued
2-12
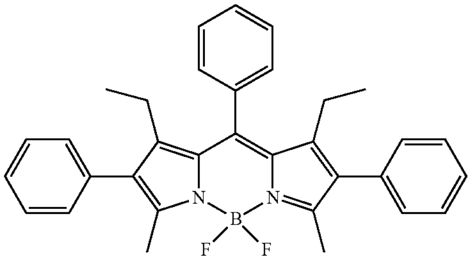
2-13
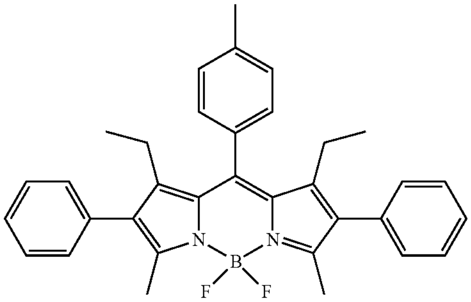
2-14
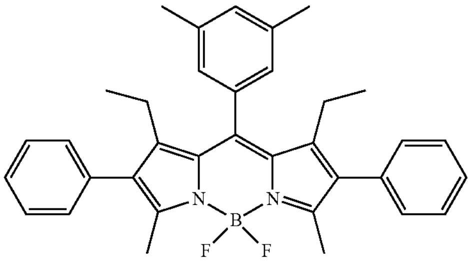
2-15
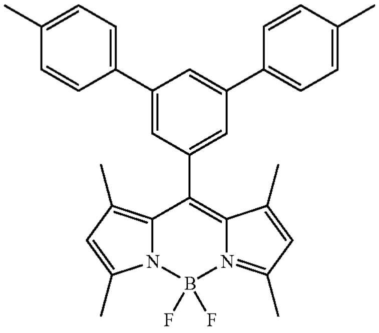
2-16
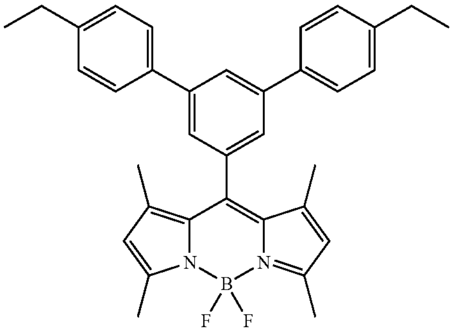
-continued
2-17
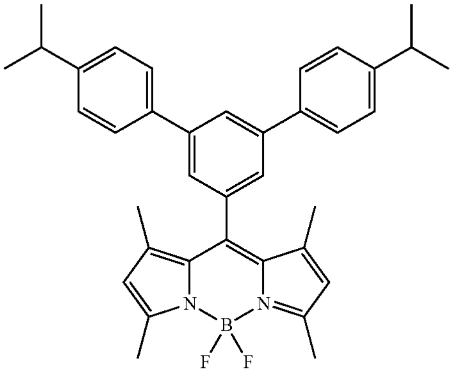
2-18
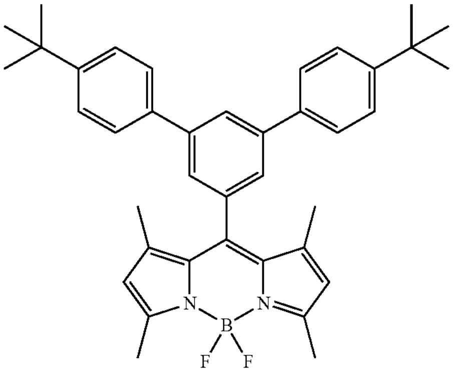
2-19
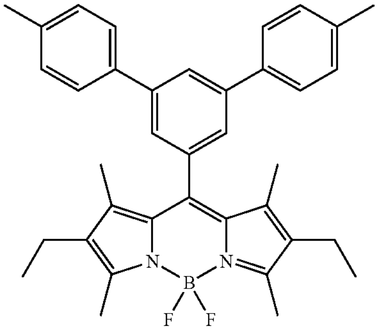
2-20
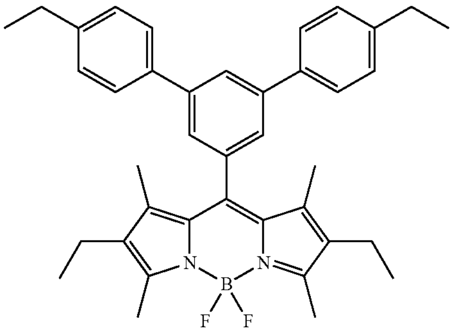

-continued
2-21
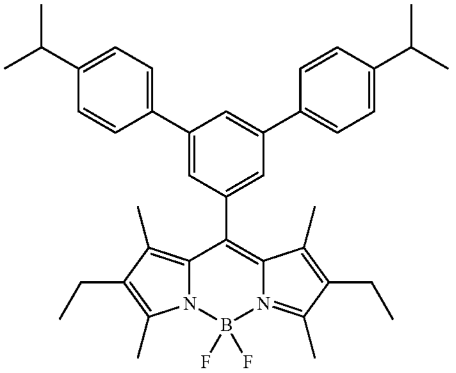
2-22
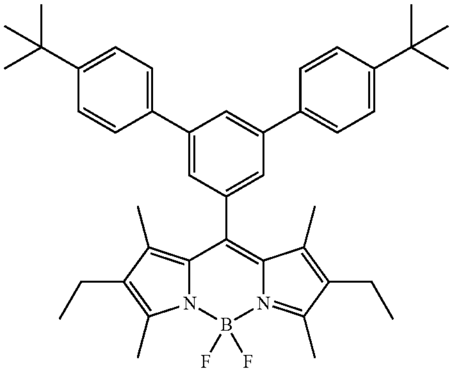
2-23
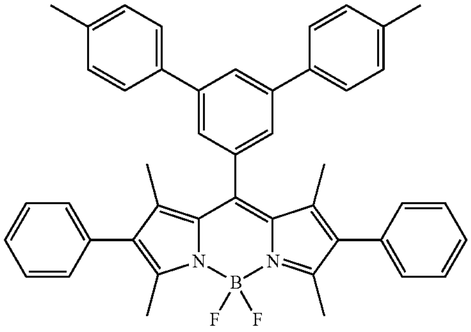
2-24
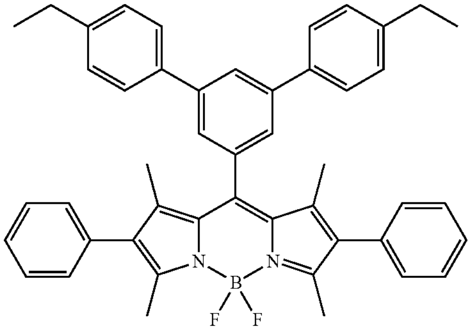
-continued
2-25
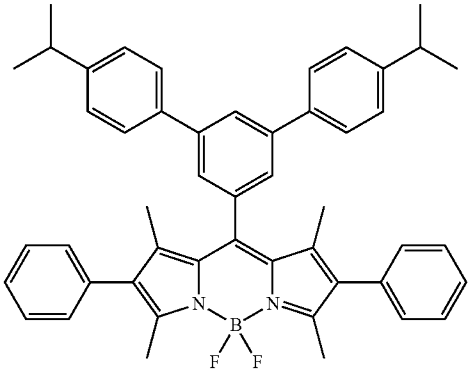
2-26
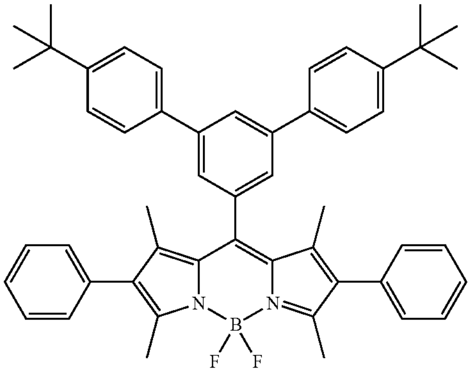
2-27
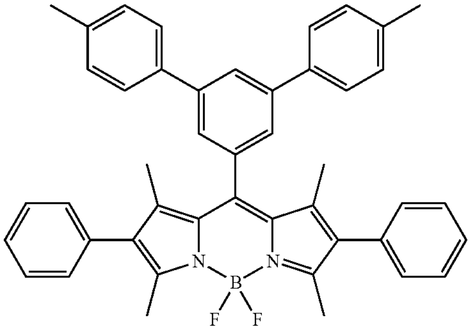
2-28
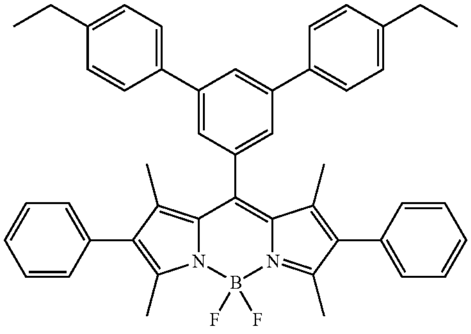

-continued 2-29

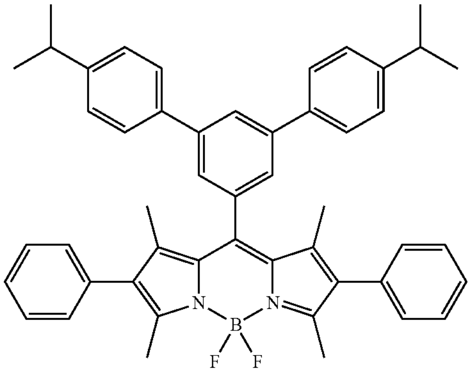

2-30

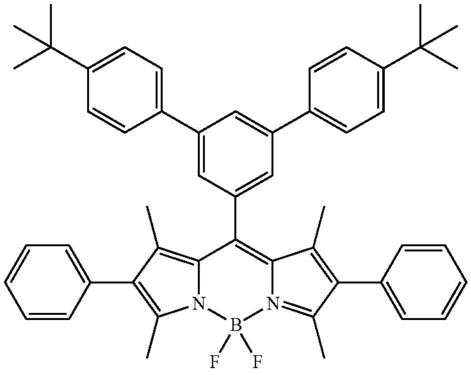

In one exemplary aspect, HOMO (Highest Occupied Molecular Orbital) energy levels and LUMO (Lowest Unoccupied Molecular Orbital) energy levels among the first compound H as the host, the second compound DF as the delayed fluorescent material and the third compound FD as the fluorescent material must be properly adjusted. For example, the host must induce the triplet excitons generated at the delayed fluorescent material to be involved in the luminescence process without quenching as non-radiative recombination in order to implement hyper fluorescence. To this end, the energy levels among the first compound H as the host, the second compound DF as the delayed fluorescent material and the third compound FD as the fluorescent material should be adjusted.

Figure 3:
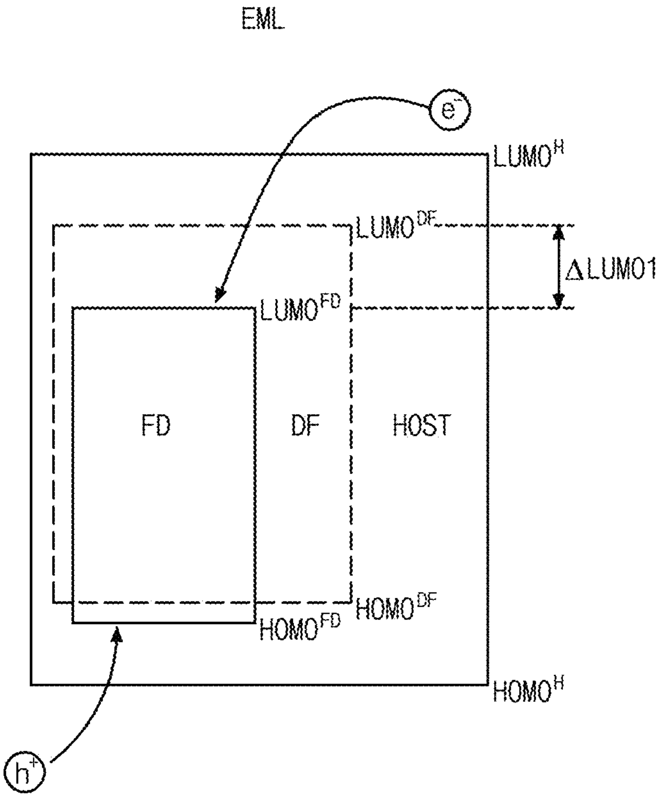
FIG. 3 is a schematic diagram illustrating efficiently transferred charges in an EML by adjusting HOMO and LUMO energy levels between delayed fluorescent material and fluorescent material.

FIG. 3 is a schematic diagram illustrating efficiently transferred charges in an EML by adjusting HOMO and LUMO energy levels between delayed fluorescent material and fluorescent material. As illustrated in FIG. 3, the first compound H as the host may be designed to have the HOMO energy level $HOMO^{H}$ deeper than the HOMO energy level HOMODF of the second compound DF as the delayed fluorescent material, and to have the LUMO energy level $LUMO^{H}$ shallower than the LUMO energy level $LUMO^{DF}$ of the second compound DF. In this case, the energy level bandgap between the HOMO energy level $HOMO^{H}$ and the LUMO energy level $LUMO^{H}$ of the first compound may be wider than the energy level bandgap between the HOMO energy level $HOMO^{DF}$ and the LUMO energy level $LUMO^{DF}$ of the second compound DF. As an example, the energy level bandgap between the HOMO energy level $HOMO^{DF}$ and the LUMO energy level $LUMO^{DF}$ of the second compound DF may be, but is not limited to, between about 2.0 eV and about 3.0 eV.

As an example, it is preferable that an energy level bandgap ($|HOMO^{H}-HOMO^{DF}|$) between the HOMO energy level ($HOMO^{H}$) of the first compound H as the host and the HOMO energy level ($HOMO^{DF}$) of the second compound DF as the delayed fluorescent material, or an energy level bandgap ($|LUMO^{H}-LUMO^{DF}|$) between the LUMO energy level ($LUMO^{H}$) of the first compound H and the LUMO energy level ($LUMO^{DF}$) of the second compound DF may be equal to or less than about 0.5 eV, for example, between about 0.1 eV to about 0.5 eV. In this case, the charges can be transported efficiently from the first compound as the host to the second compound as the delayed fluorescent material and thereby enhancing the ultimate luminous efficiency in the EML 240.

In one exemplary aspect, the energy level bandgap ΔLUMO1 between the LUMO energy level $LUMO^{DF}$ of the second compound DF and the LUMO energy level $LUMO^{FD}$ of the third compound FD satisfies the following relationship in Equation (1). Also, the HOMO energy level $HOMO^{DF}$ of the second compound DF and the HOMO energy level $HOMO^{FD}$ of the third compound FD satisfy the following relationship in Equation (2):

$$-0.6\text{ eV}\leq LUMO^{FD}-LUMODF\leq 0.1\text{ eV} \quad (1);$$

$$-0.3\text{ eV}\leq HOMO^{DF}-HOMO^{FD}\leq 0.3\text{ eV} \quad (2).$$

When the energy level bandgap Δ LUMO1 between the LUMO energy level $LUMO^{DF}$ of the second compound DF and the LUMO energy level $LUMO^{FD}$ of the third compound satisfies the relationship in Equation (1), electrons can be transferred from the first compound H as the host to the second compound DF as the delayed fluorescent material. As excitons are recombined at the second compound DF, it is possible realize 100% internal quantum efficiency by utilizing RISC mechanism. The singlet exciton energy generated at the second compound DF via RISC mechanism is transferred to the third compound FD as the fluorescent material through FRET, and efficient luminescence is occurred at the third compound FD.

As an example, the energy level bandgap ΔLUMO1 between the LUMO energy level $LUMO^{DF}$ of the second compound DF and the LUMO energy level $LUMO^{FD}$ of the third compound may satisfy the following relationship in Equation (3). Also, the HOMO energy level $HOMO^{DF}$ of the second compound DF and the HOMO energy level $HOMO^{FD}$ of the third compound may satisfy the following relationship in Equation (4):

$$-0.6\text{ eV}\leq LUMO^{FD}-LUMODF\leq -0.3\text{ eV} \quad (2);$$

$$-0.3\text{ eV}\leq HOMO^{DF}-HOMO^{FD}\leq 0.2\text{ eV} \quad (4).$$

Figure 4:
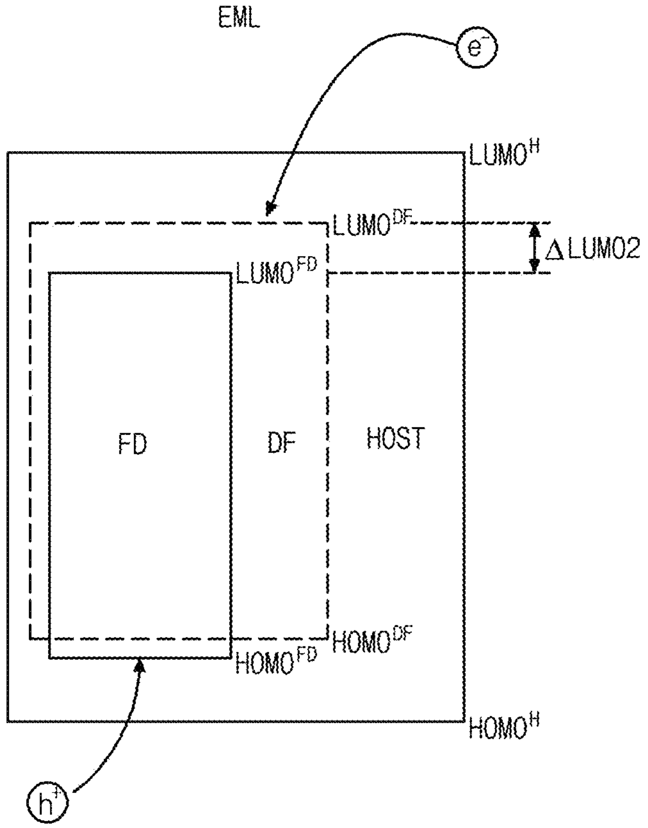
FIG. 4 is a schematic diagram illustrating charge transfer issue in an EML as the energy level bandgap between LUMO energy levels of delayed fluorescent material and fluorescent material.

FIG. 4 is a schematic diagram illustrating charge transfer issue in an EML as the energy level bandgap between LUMO energy levels of delayed fluorescent material and fluorescent material. As illustrated in FIG. 4, when the energy level bandgap ΔLUMO2 between the LUMO energy level $LUMO^{DF}$ of the second compound DF and the LUMO energy level $LUMO^{FD}$ of the third compound FD is more than 0.6 eV, electrons are directly to the third compound FD as the fluorescent material, not the second compound DF as the delayed fluorescent material, from the first compound as the host owing to the large LUMO energy level bandgap ΔLUMO2 between the second compound DF and the third compound FD, and therefore, electrons are trapped at the third compound. As the electrons trapped at the third compound FD as the fluorescent material are recombined directly, the triplet exciton energy generated at the third compound is quenched as non-radiative recombination, thus its luminous efficiency decreases. Also, since holes and electrons are not injected into the EML 240 in balance owing to electrons excessively trapped at the third compound, its luminous efficiency further decreases.

Figure 5:
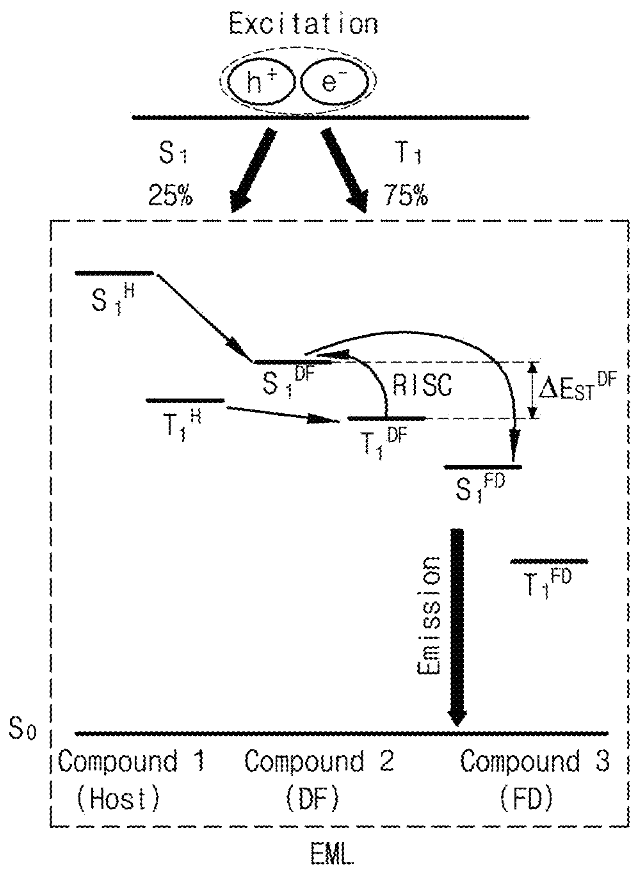
FIG. 5 is a schematic diagram illustrating a luminous mechanism by singlet and triplet energy levels among luminous materials in an EML in accordance with one exemplary aspect of the present disclosure.

Now, we will describe the luminous mechanism in the EML 240. FIG. 5 is a schematic diagram illustrating a luminous mechanism by singlet and triplet energy levels among luminous materials in an EML in accordance with one exemplary aspect of the present disclosure. As illustrated in FIG. 5, each of the excited singlet energy level $S_1H$ and the excited triplet energy level $T_1H$ of the first compound H, which can be the host in the EML 240, is higher than each of the excited singlet energy level $S_1^{DF}$ and the excited triplet energy level $T_1^{DF}$ of the second compound DF having the delayed fluorescent property, respectively. As an example, the excited triplet energy level $T_1H$ of the first compound H may be higher than the excited triplet energy level $T_1^{DF}$ of the third compound DF by at least about 0.2 eV, preferably at least about 0.3 eV, and more preferably at least about 0.5 eV.

When the excited triplet energy level $T_1H$ and/or the excited singlet energy level $T_1^{H}$ of the first compound is not high enough than the excited triplet energy level $T_1^{DF}$ and/or the excited singlet energy level $S_1^{DF}$ of the second compound DF, the triplet state exciton energy of the second compound DF may be reversely transferred to the excited triplet energy level $T_1H$ of the first compound. In this case, the triplet exciton reversely transferred to the first compound H where the triplet exciton cannot be emitted is quenched as non-emission so that the triplet exciton energy of the second compound DF having the delayed fluorescent property cannot contribute to luminescence. As an example, the second compound DF having the delayed fluorescent property may have the energy level bandgap $\Delta E_{ST}^{DF}$ between the excited singlet energy level $S_1^{DF}$ and the excited triplet energy level $T_1^{DF}$ equal to or less than about 0.3 eV, for example between about 0.05 eV and about 0.3 eV.

In addition, the singlet exciton energy, which is generated at the second compound DF as the delayed fluorescent material that is converted to ICT complex by RISC in the EML 240, should be efficiently transferred to the third compound FD as the fluorescent material so as to implement OLED D1 having high luminous efficiency and high color purity. To this end, the excited triplet energy level $T_1^{DF}$ of the second compound DF as the delayed fluorescent material is higher than the excited triplet energy level $T_1^{FD}$ of the third compound FD as the fluorescent material. Optionally, the excited singlet energy level $S_1^{DF}$ of the second compound DF may be higher than the excited singlet energy level $S_1^{FD}$ of the third compound FD.

Returning to FIG. 2, the HIL 250 is disposed between the first electrode 210 and the HTL 260 and improves an interface property between the inorganic first electrode 210 and the organic HTL 260. In one exemplary aspect, the HIL 250 may include, but is not limited to, 4,4'4"-Tris(3-methylphenylamino)triphenylamine (MTDATA), 4,4',4"-Tris(N,N-diphenyl-amino)triphenylamine (NATA), 4,4',4"-Tris(N-(naphthalene-1-yl)-N-phenyl-amino)triphenylamine (1T-NATA), 4,4',4"-Tris(N-(naphthalene-2-yl)-N-phenyl-amino) triphenylamine (2T-NATA), Copper phthalocyanine (CuPc), Tris(4-carbazoyl-9-yl-phenyl)amine (TCTA), N,N'-Diphenyl-N,N'-bis(1-naphthyl)-1,1'-biphenyl-4,4"-diamine (NPB; NPD), 1,4,5,8,9,11-Hexaazatriphenylenehexacarbonitrile (Dipyrazino[2,3-f:2'3'-h]quinoxaline-2,3,6,7,10,11-hexacarbonitrile; HAT-CN), 1,3,5-tris[4-(diphenylamino)phenyl] benzene (TDAPB), poly(3,4-ethylenedioxythiphene)polystyrene sulfonate (PEDOT/PSS) and/or N-(biphenyl-4-yl)-9,9-dimethyl-N-(4-(9-phenyl-9H-carbazol-3-yl)phenyl)-9H-fluoren-2-amine. The HIL 250 may be omitted in compliance with a structure of the OLED D1.

The HTL 260 is disposed adjacently to the EML 240 between the first electrode 210 and the EML 240. In one exemplary aspect, the HTL 260 may include, but is not limited to, N,N'-Diphenyl-N,N'-bis(3-methylphenyl)-1,1'-biphenyl-4,4'-diamine (TPD), NPB, CBP, Poly[N,N'-bis(4-butylphenyl)-N,N'-bis(phenyl)-benzidine] (Poly-TPD), Poly[(9,9-dioctylfluorenyl-2,7-diyl)-co-(4,4'-(N-(4-sec-butylphenyl)diphenylamine))] (TFB), Di-[4-(N,N-di-p-tolyl-amino)-phenyl]cyclohexane (TAPC), 5-Di(9H-carbazol-9-yl)-N,N-diphenylaniline (DCDPA), N-(biphenyl-4-yl)-9,9-dimethyl-N-(4-(9-phenyl-9H-carbazol-3-yl)phenyl)-9H-fluoren-2-amine and/or N-(biphenyl-4-yl)-N-(4-(9-phenyl-9H-carbazol-3-yl)phenyl)biphenyl-4-amine.

The ETL 270 and the EIL 280 may be laminated sequentially between the EML 240 and the second electrode 230. The ETL 270 includes a material having high electron mobility so as to provide electrons stably with the EML 240 by fast electron transportation. In one exemplary aspect, the ETL 270 may comprise, but is not limited to, any one of oxadiazole-based compounds, triazole-based compounds, phenanthroline-based compounds, benzoxazole-based compounds, benzothiazole-based compounds, benzimidazole-based compounds, triazine-based compounds, and the like.

As an example, the ETL 270 may comprise, but is not limited to, tris-(8-hydroxyquinoline aluminum (Alq3), 2-biphenyl-4-yl-5-(4-t-butylphenyl)-1,3,4-oxadiazole (PBD), spiro-PBD, lithium quinolate (Liq), 1,3,5-Tris(N-phenylbenzimidazol-2-yl)benzene (TPBi), Bis(2-methyl-8-quinolinolato-N1,O8)-(1,1'-biphenyl-4-olato)aluminum (BAlq), 4,7-diphenyl-1,10-phenanthroline (Bphen), 2,9-Bis(naphthalene-2-yl)4,7-diphenyl-1,10-phenanthroline (NBphen), 2,9-Dimethyl-4,7-diphenyl-1,10-phenaathroline (BCP), 3-(4-Biphenyl)-4-phenyl-5-tert-butylphenyl-1,2,4-triazole (TAZ), 4-(Naphthalen-1-yl)-3,5-diphenyl-4H-1,2,4-triazole (NTAZ), 1,3,5-Tri(p-pyrid-3-yl-phenyl)benzene (TpPyPB), 2,4,6-Tris(3'-(pyridin-3-yl)biphenyl-3-yl)1,3,5-triazine (TmPPPyTz), Poly[9,9-bis(3'-(N,N-dimethyl)-N-ethylammonium)-propyl)-2,7-fluorene]-alt-2,7-(9,9-dioctylfluorene)] (PFNBr), tris(phenylquinoxaline) (TPQ) and/or TSPO1.

The EIL 280 is disposed between the second electrode 230 and the ETL 270, and can improve physical properties of the second electrode 230 and therefore, can enhance the lifetime of the OLED D1. In one exemplary aspect, the EIL 280 may comprise, but is not limited to, an alkali metal halide or an alkaline earth metal halide such as LiF, CsF, NaF, $BaF_2$ and the like, and/or an organic metal compound such as lithium quinolate, lithium benzoate, sodium stearate, and the like.

When holes are transferred to the second electrode 230 via the EML 240 and/or electrons are transferred to the first electrode 210 via the EML 240, the OLED D1 may have short lifetime and reduced luminous efficiency. In order to prevent these phenomena, the OLED D1 in accordance with this aspect of the present disclosure may have at least one exciton blocking layer adjacent to the EML 240.

For example, the OLED D1 of the exemplary aspect includes the EBL 265 between the HTL 260 and the EML 240 so as to control and prevent electron transfers. In one exemplary aspect, the EBL 265 may comprise, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, mCP, mCBP, CuPc, N,N'-bis[4-(bis(3-methylphenyl)amino) phenyl]-N,N'-diphenyl-[1,1'-biphenyl]-4,4'-diamine (DNTPD), TDAPB and/or 3,6-bis(N-carbazolyl)-N-phenyl-carbazole.

In addition, the OLED D1 may further include the HBL 275 as a second exciton blocking layer between the EML 240 and the ETL 270 so that holes cannot be transferred from the EML 240 to the ETL 270. In one exemplary aspect, the HBL 275 may comprise, but is not limited to, oxadiazole-based compounds, triazole-based compounds, phenanthroline-based compounds, benzoxazole-based compounds, benzothiazole-based compounds, benzimidazole-based compounds, and triazine-based compounds each of which can be used in the ETL 270.

For example, the HBL 275 may comprise a compound having a relatively low HOMO energy level compared to the luminescent materials in EML 240. The HBL 275 may comprise, but is not limited to, BCP, BAlq, $Alq_3$, PBD, spiro-PBD, Liq, Bis-4,5-(3,5-di-3-pyridylphenyl)-2-methylpyrimidine (B3PYMPM), DPEPO, 9-(6-(9H-carbazol-9-yl)pyridine-3-yl)-9H-3,9'-bicarbazole and combination thereof.

In one exemplary aspect, the contents of the first compound (Compound 1, Host) H may be larger than the contents of the second compound (Compound 2) DF and the contents of the second compound DF may be larger than the contents of the third compound (Compound 3) FD in the EML 240. In this case, exciton energy is efficiently transferred from the second compound DF to the third compound FD via FRET mechanism. As an example, the EML 240 may comprise, but is not limited to, the first compound H between about 60 wt % and about 75 wt %, the second compound DF between about 20 wt % and about 40 wt %, and the third compound FD between about 0.1 wt % and about 5 wt %.

Figure 6:
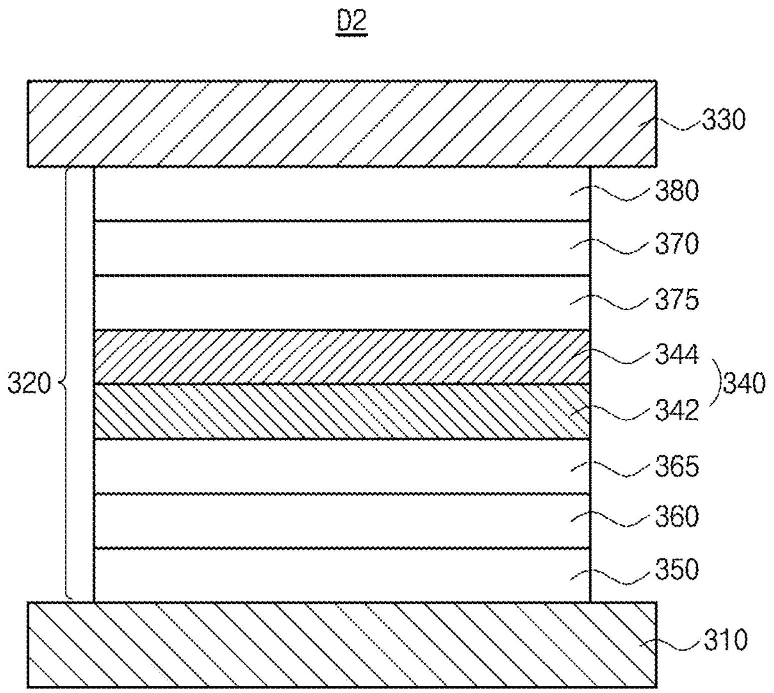
FIG. 6 is a schematic cross-sectional view illustrating an OLED in accordance with another exemplary aspect of the present disclosure.
Figure 7:
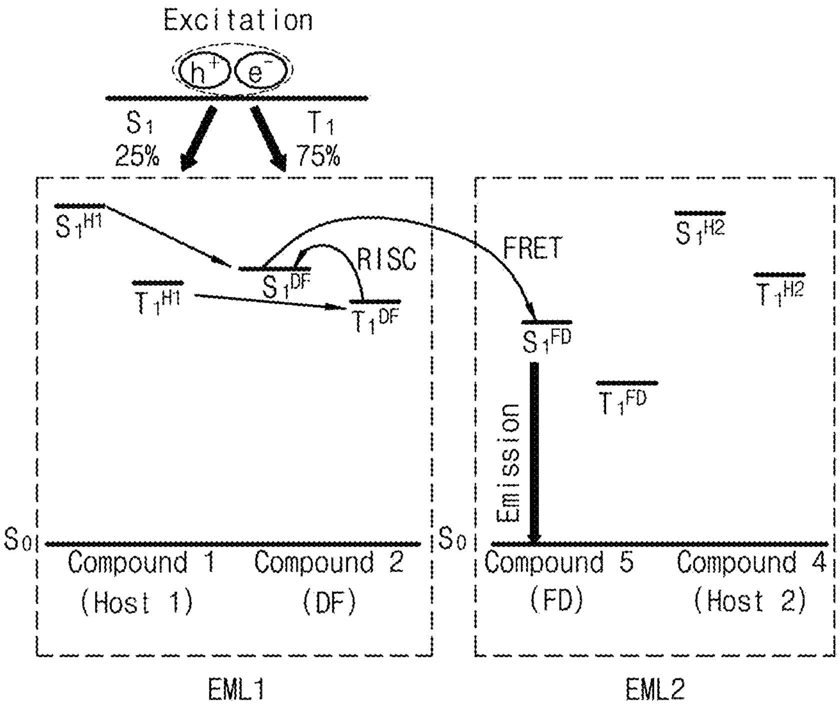
FIG. 7 is a schematic diagram illustrating a luminous mechanism by singlet and triplet energy levels among luminous materials in an EML in accordance with another exemplary aspect of the present disclosure.

In the above aspect, the delayed fluorescent material and the fluorescent material are included within the same EML. Unlike that aspect, the delayed fluorescent material and the fluorescent material are included in separate EMLs. FIG. 6 is a schematic cross-sectional view illustrating an OLED in accordance with another exemplary aspect of the present disclosure. FIG. 7 is a schematic diagram illustrating a luminous mechanism by singlet and triplet energy levels among luminous materials in an EML in accordance with another exemplary aspect of the present disclosure.

As illustrated in FIG. 6, the OLED D2 includes first and second electrodes 310 and 330 facing each other and an emissive layer 320 having single emitting part disposed between the first and second electrodes 310 and 330. The organic light emitting display device 100 includes a red pixel region, a green pixel region and a blue pixel region, and the OLED D2 may be disposed in the green pixel region. In one exemplary aspect, the emissive layer 320 comprises an EML 340. Also, the emissive layer 320 may comprise at least one of an HTL 360 disposed between the first electrode 310 and the EML 340 and an ETL 370 disposed between the second electrode 230 and the EML 340. Also, the emissive layer 320 may further comprise at least one of a HIL 350 disposed between the first electrode 310 and the HTL 360 and an EIL 380 disposed between the second electrode 330 and the ETL 370. Alternatively, the emissive layer 320 may further comprise an EBL 365 disposed between the HTL 360 and the EML 340 and/or a HBL 375 disposed between the EML 340 and the ETL 370. The configuration of the first and second electrodes 310 and 330 as well as other layers except the EML 340 in the emissive layer 320 may be substantially identical to the corresponding electrodes and layers in the OLED D1.

The EML 340 comprises a first EML (EML1, lower EML, first layer) 342 disposed between the EBL 365 and the HBL 375 and a second EML (EML2, upper EML, second layer) 344 disposed between the EML1 342 and the HBL 375. One of the EML1 342 and the EML2 344 includes the second compound (Compound 2, first dopant) DF of the delayed fluorescent material, and the other of the EML1 342 and the EML2 344 includes a fifth compound (Compound 5, dopant 2) FD of the fluorescent material. Also, each of the EML1 342 and the EML2 344 includes the first compound (Compound 1, Host 1) H1 of the first host and a fourth compound (Compound 4, Host 2) H2 of the second host. As an example, the EML1 342 may include the first compound H1 of the first host and the second compound DF of the delayed fluorescent material, and the EML2 344 may include the fourth compound H2 of the second host and the fifth compound FD of the fluorescent material.

The second compound DF in the EML1 342 may any delayed fluorescent material having the structure of Chemical Formulae 1 to 2. The triplet exciton energy of the second compound DF having delayed fluorescent property can be transferred upwardly to its own singlet exciton energy via RISC mechanism. While the second compound DF has high internal quantum efficiency, but it has poor color purity due to its wide FWHM.

The EML2 344 comprises the fifth compound FD of the florescent material. The fifth compound FD includes any organic compound having the structure of Chemical Formulae 3 to 4. While the fifth compound FD of the fluorescent material having the structure of Chemical Formulae 3 and 4 has an advantage in terms of color purity due to its narrow FWHM, but its internal quantum efficiency is low because its triplet exciton cannot be involved in the luminescence process.

However, in this exemplary aspect, the singlet exciton energy and the triplet exciton energy of the second compound DF having the delayed fluorescent property in the EML1 342 can be transferred to the fifth compound FD in the EML2 344 disposed adjacently to the EML1 342 by FRET mechanism, and the ultimate light emission occurs in the fifth compound FD within the EML2 344.

In other words, the triplet exciton energy of the second compound DF is converted upwardly to its own singlet exciton energy in the EML1 342 by RISC mechanism. Then, the converted singlet exciton energy of the second compound DF is transferred to the singlet exciton energy of the fifth compound FD in the EML2 344. The fifth compound FD in the EML2 344 can emit light using the triplet exciton energy as well as the singlet exciton energy. As the singlet exciton energy generated at the second compound DF in the EML1 342 is efficiently transferred to the fifth compound FD in the EML2 344, the OLED D2 can implement hyper fluorescence. In this case, while the second compound DF compound having the delayed fluorescent property only acts as transferring exciton energy to the fifth compound FD, substantial light emission is occurred in the EML2 344 including the fifth compound FD. The OLED D2 can enhance quantum efficiency and color purity owing to narrow FWHM.

Also, each of the EML1 342 and the EML2 344 includes the first compound H1 of the first host and the fourth compound H2 of the second host, respectively. The exciton energies generated at the first and fourth compounds H1 and H2 primarily transferred to the second compound DF of the delayed fluorescent material. As illustrated in FIG. 7, each of the excited singlet energy levels $S_1^{H1}$ and $S_1^{H2}$ and excited triplet energy levels $T_1^{H1}$ and $T_1^{H2}$ of the first and fourth compounds H1 and H2 may be higher than each of the excited singlet energy level $S_1^{DF}$ and the excited triplet energy level $T_1^{DF}$ of the second compound DF having the delayed fluorescent property, respectively. For example, the excited triplet energy levels $T_1^{H1}$ and $T_1^{H2}$ of the first and fourth compound H1 and H2 may be higher than the excited triplet energy level $T_1^{DF}$ of the second compound DF by at least about 0.2 eV, for example by at least 0.3 eV, preferably by at least 0.5 eV.

Also, the excited singlet energy level $S_1^{H2}$ of the fourth compound H2 of the second host is higher than an excited singlet energy level $S_1^{FD}$ of the fifth compound FD of the fluorescent material. Optionally, the excited triplet energy level $T_1^{H2}$ of the fourth compound H2 is higher than an excited triplet energy level $T_1^{FD}$ of the fifth compound FD. In this case, the singlet exciton energy generated at the fourth compound H2 may be transferred to the singlet energy of the fifth compound FD.

In addition, the singlet exciton energy, which is generated at the second compound DF having the delayed fluorescent property that is converted to ICT complex by RISC in the EML1 342, should be efficiently transferred to the fifth compound FD of the fluorescent material in the EML2 344. To this end, the excited triplet energy level $T_1^{DF}$ of the second compound DF as the delayed fluorescent material in the EML1 342 is higher than the excited triplet energy level $T_1^{FD}$ of the fifth compound FD of the fluorescent material FD in the EML2 344. Optionally, the excited singlet energy level $S_1^{DF}$ of the second compound DF in the EML1 342 may be higher than the excited singlet energy level $S_1^{FD}$ of the fifth compound FD in the EML2 344

Moreover, the energy level bandgap ($|HOM^{OH}-HOM^{ODF}|$) between the HOMO energy level ($HOM^{OH}$) of the first and/or fourth compounds H1 and H2 and the HOMO energy level ($HOM^{ODF}$) of the second compound DF, or the energy level bandgap ($|LUM^{OH}-LUM^{ODF}|$) between a LUMO energy level ($LUMO^{H}$) of the first and/or fourth compounds H1 and H2 and the LUMO energy level ($LUMO^{DF}$) of the second compound DF may be equal to or less than about 0.5 eV. When the energy levels among the luminous materials is not satisfy the above-described relationships, quenching as a non-radiative recombination may be occurred at the second compound DF, or exciton energies may not be transferred to the second and fifth compounds DF and FD from the first and fourth compounds H1 and H2, thus the OLED D2 may have deteriorated quantum efficiency.

In addition, the LUMO energy levels $LUMO^{DF}$ and $LUMO^{FD}$ between the second compound DF of the delayed fluorescent material and the fifth compound FD of the fluorescent material satisfy the relationship in Equation (1) or (3). The HOMO energy levels $HOMO^{DF}$ and $HOMO^{FD}$ of the second and fifth compounds DF and FD satisfy the relationship in Equation (2) or (4).

The first compound H1 may be identical to or different from the fourth compound H2. As an example, each of the first and fourth compounds H and H2 may independently comprise, but is not limited to, mCP-CN, CBP, mCBP, mCP, DPEPO, PPT, TmPyPB, PYD-2Cz, DCzDBT, DCzTPA, pCzB-2CN, mCzB-2CN, TSPO1, CCP, 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole and/or 9-(6-(9H-carbazol-9-yl)pyridin-3-yl)-9H-3,9'-bicabazole).

Each of the contents of the first and fourth compounds H1 and H2 in the EML 342 and the EML 344 may be larger than each of the contents of the second and fifth compounds DF and FD in the same layer, respectively. Also, the contents of the second compound DF in the EML1 342 may larger than the contents of the fifth compound FD in the EML2 344. In this case, exciton energy is efficiently transferred from the second compound DF to the fifth compound FD via FRET mechanism. As an example, the EML1 342 may comprise the second compound DF between about 1 wt % and about 50 wt %, preferably about 10 wt % and about 40 wt %, and more preferably about 20 wt % and about 40 wt %. The EML2 344 may comprise the fourth compound H2 between about 90 wt % and about 99 wt %, preferably about 95 wt % and 99 wt %, and comprise the fifth compound FD between about 1 wt % and about 10 wt %, preferably about 1 wt % and 5 wt %.

In one exemplary aspect, when the EML2 344 is disposed adjacently to the HBL 375, the fourth compound H2 in the EML4 344 may be the same material as the HBL 375. In this case, the EML1 344 may have a hole blocking function as well as an emission function. In other words, the EML2 344 can act as a buffer layer for blocking holes. In one aspect, the HBL 375 may be omitted where the EML2 344 may be a hole blocking layer as well as an emitting material layer.

In another aspect, when the EML2 344 is disposed adjacently to the EBL 365, the fourth compound H2 in the EML2 344 may be the same as the EBL 365. In this case, the EML2 344 may have an electron blocking function as well as an emission function. In other words, the EML2 344 can act as a buffer layer for blocking electrons. In one aspect, the EBL 365 may be omitted where the EML2 344 may be an electron blocking layer as well as an emitting material layer.

Figure 8:
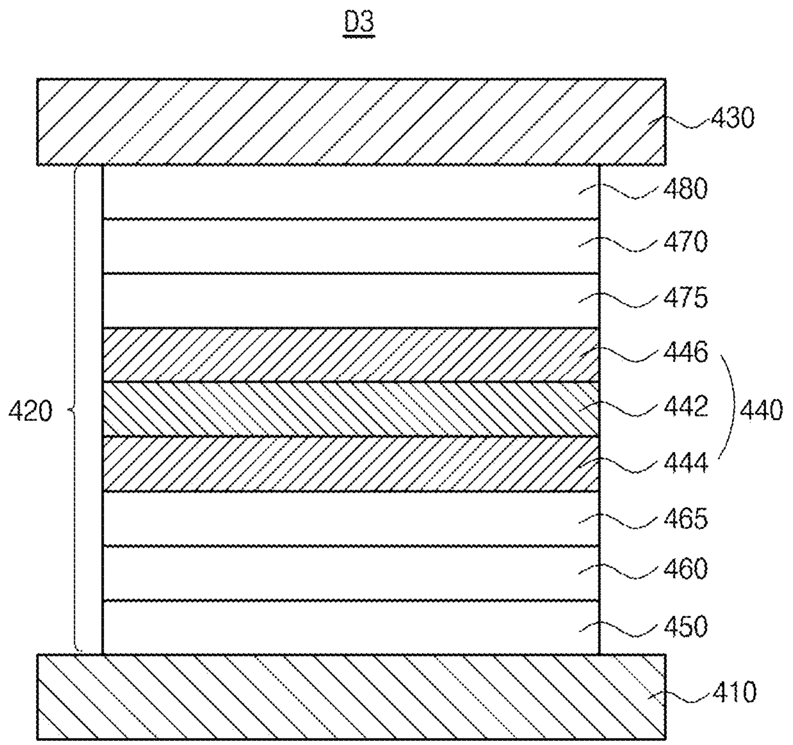
FIG. 8 is a schematic cross-sectional view illustrating an OLED in accordance with still another exemplary aspect of the present disclosure.
Figure 9:
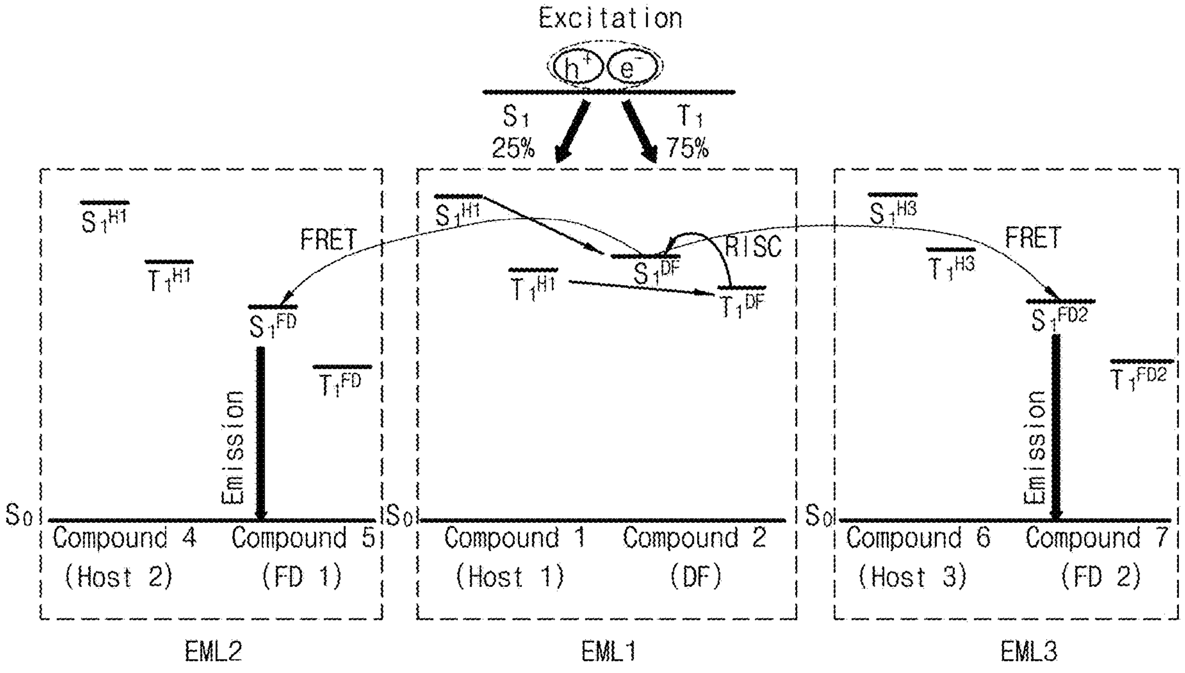
FIG. 9 is a schematic diagram illustrating a luminous mechanism by singlet and triplet energy levels among luminous materials in an EML in accordance with still another exemplary aspect of the present disclosure.

An OLED having a triple-layered EML will be explained. FIG. 8 is a schematic cross-sectional view illustrating an OLED having a triple-layered EML in accordance with another exemplary aspect of the present disclosure. FIG. 9 is a schematic diagram illustrating luminous mechanism by energy level bandgap among luminous materials in accordance with another exemplary aspect of the present disclosure.

As illustrated in FIG. 8, the OLED D3 comprises first and second electrodes 410 and 430 facing each other and an emissive layer 420 disposed between the first and second electrodes 410 and 430. The organic light emitting display device 100 includes a red pixel region, a green pixel region and a blue pixel region, and the OLED D3 may be disposed in the green pixel region.

In one exemplary aspect, the emissive layer 420 having single emitting part comprises a three-layered EML 440. The emissive layer 420 may comprise at least one of a HTL 460 disposed between the first electrode 410 and the EML 440 and an ETL 370 disposed between the second electrode 430 and the EML 440. Also, the emissive layer 420 may further comprise at least one of a HIL 450 disposed between the first electrode 410 and the HTL 460 and an EIL 480 disposed between the second electrode 420 and the ETL 470. Alternatively, the emissive layer 420 may further comprise an EBL 465 disposed between the HTL 460 and the EML 440 and/or a HBL 475 disposed between the EML 440 and the ETL 470. The configurations of the first and second electrodes 410 and 430 as well as other layers except the EML 440 in the emissive layer 420 is substantially identical to the corresponding electrodes and layers in the OLEDs D1 and D2.

The EML 440 comprises a first EML (EML1, middle EML, first layer) 442, a second EML (EML2, lower EML, second layer) 444 and a third EML (EML3, upper EML, third layer) 446. The EML1 442 is disposed between the EBL 465 and the HBL 475, the EML2 444 is disposed between the EBL 465 and the EML1 442 and the EML3 446 is disposed between the EML1 442 and the HBL 475.

The EML1 442 includes the second compound (Compound 2, first dopant) DF of the delayed fluorescent material. Each of the EML2 444 and the EML3 446 includes the fifth compound (Compound 5, second dopant) FD1 and a seventh compound (Compound 7, third dopant) FD2 each of which is the fluorescent material. Also, each of the EML1 442, the EML2 444 and the EML3 446 includes the first compound (Compound 1, Host 1) H1 of the first host, the fourth compound (Compound 4, Host 2) H2 of the second host and a sixth compound (Compound 6, Host 3) H3 of the third host, respectively.

In accordance with this aspect, the singlet energy as well as the triplet energy of the second compound DF, i.e. the delayed fluorescent material in the EML 442 can be transferred to the fifth and seventh compounds FD1 and FD2, i.e. the fluorescent materials each of which is included in the EML2 444 and EML3 446 disposed adjacently to the EML1 442 by FRET energy transfer mechanism. Accordingly, the ultimate emission occurs in the fifth and seventh compounds FD1 and FD2 in the EML2 444 and the EML3 446.

In other words, the triplet exciton energy of the second compound DF having the delayed fluorescent property in the EML1 442 is converted upwardly to its own singlet exciton energy by RISC mechanism, then the singlet exciton energy of the second compound DF is transferred to the singlet exciton energy of the fifth and seventh compounds FD1 and FD2 in the EML2 444 and the EML3 446 because the second compound DF has the excited singlet energy level $S_1^{DF}$ higher than each of the excited singlet energy levels $S_1^{FD1}$ and $S_1^{FD2}$ of the fifth and seventh compounds FD1 and FD2 (see, FIG. 9). The singlet exciton energy of the second compound DF in the EML1 442 is transferred to the fifth and seventh compounds FD1 and FD2 in the EML2 444 and the EML3 446 which are disposed adjacently to the EML1 442 by FRET mechanism.

The fifth and seventh compounds FD1 and FD2 in the EML2 444 and EML3 446 can emit light using the singlet exciton energy and the triplet exciton energy derived from the second compound DF. Each of the fifth and seventh compounds FD1 and FD2 has relatively narrow FWHM compared to the second compound DF. In this aspect, the OLED D3 can improve its quantum efficiency and color purity owing to narrow FWHM, and the ultimate emission occurs in the fifth and seventh compounds FD1 and FD2 within the EML2 444 and the EML3 446.

The second compound DF of the delayed fluorescent material comprises any triazine-based organic compound having the structure of Chemical Formulae 1 to 2. Each of the fifth and seventh compounds FD1 and FD2 of the fluorescent material comprises independently any organic compound including BODIPY core having the structure of Chemical Formulae 3 to 4.

As an example, the LUMO energy levels $LUMO^{DF}$ and $LUMO^{FD1}$ and $LUMO^{FD2}$ between the second compound DF of the delayed fluorescent material and the fifth and seventh compounds FD1 and FD2 of the fluorescent material satisfy the relationship in Equation (1) or (3). The HOMO energy levels $HOMO^{DF}$ and $HOMO^{FD1}$ and $HOMO^{FD2}$ of the second, fifth and seventh compounds DF and FD1 and FD2 satisfy the relationship in Equation (2) or (4).

Also, the singlet and triplet energy levels among the luminous materials should be properly adjusted in order to implement efficient luminescence. Referring to FIG. 9, each of the excited singlet energy levels $S_1^{H1}$, $S_1^{H2}$ and $S_1^{H3}$ and excited triplet energy levels $T_1^{H1}$, $T_1^{H2}$ and $T_1^{H3}$ of the first, fourth and sixth compound H1, H2 and H3, each of which is the first host, the second host and the third host, may be higher than each of the excited singlet energy level $S_1^{DF}$ and the excited triplet energy level $T_1^{DF}$ of the second compound DF having the delayed fluorescent property, respectively.

The singlet exciton energy, which is generated at the second compound DF having the delayed fluorescent property that is converted to ICT complex by RISC in the EML1 442, should be efficiently transferred to the fifth and seventh compounds FD1 and FD2 of the fluorescent material in the EML2 444 and the EML3 446. To this end, the excited triplet energy level $T_1^{DF}$ of the second compound DF of the delayed fluorescent material in the EML1 442 is higher than the excited triplet energy levels $T_1^{FD1}$ and $T_1^{FD2}$ of the fifth and seventh compounds FD1 and FD2 of the fluorescent material in the EML2 444 and the EML3 446. Optionally, the excited singlet energy level $S_1^{DF}$ of the second compound DF in the EML1 442 may be higher than the excited singlet energy level $S_1^{FD1}$ and $S_1^{FD2}$ of the fifth and seventh compounds FD1 and FD2 in the EML2 444 and the EML3 446.

In addition, exciton energy transferred from the delayed fluorescent material to the fluorescent material should not transfer to the fourth and sixth compounds H2 and H3 in order to implement efficient luminescence. To this end, each of the excited singlet energy levels $S_1^{H2}$ and $S_1^{H3}$ of the fourth and sixth compounds H2 and H3, each of which may be the second host and the third host, is higher than excited singlet energy levels $S_1^{FD1}$ and $S_1^{FD2}$ of the fifth and seventh compounds FD1 and FD2 of the fluorescent material, respectively. Optionally, each of the excited triplet energy level $T_1^{H2}$ and $T_1^{H3}$ of the fourth and sixth compounds H2 and H3 is higher than excited triplet energy levels $T_1^{FD1}$ and $T_1^{FD2}$ of the fifth and seventh compounds FD1 and FD2, respectively. In this case, the singlet exciton energy generated at the fourth and sixth compounds H2 and H3 may be transferred to the singlet energy of the fifth and seventh compounds FD1 and FD2.

As described above, each of the EML1 442, the EML2 444 and the EML3 446 includes the first, fourth and sixth compounds H1, H2 and H3 each of which may be the first host, second host and the third host. As an example, each of the first, fourth and sixth compounds H1, H2 and H3 may be identical to or different from each other. For example, each of the first, fourth and sixth compounds H1, H2 and H3 may independently comprise, but is not limited to, mCP-CN, CBP, mCBP, mCP, DPEPO, PPT, TmPyPB, PYD-2Cz, DCzDBT, DCzTPA, pCzB-2CN, mCzB-2CN, TSPO1, CCP, 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole and/or 9-(6-(9H-carbazol-9-yl)pyridin-3-yl)-9H-3,9'-bicabazole).

The contents of the second compound DF in the EML1 442 may be larger than each of the contents of the fifth and seventh compounds FD1 and FD2 in the EML2 444 or the EML3 446. In this case, exciton energy can be transferred sufficiently from the second compound DF in the EML1 442 to the fifth and seventh compounds FD1 and FD2 in the EML2 444 and the EML3 446 via FRET mechanism. As an example, the EML1 442 may comprise the second compound DF between about 1 wt % and about 50 wt %, preferably about 10 wt % and about 40 wt %, and more preferably about 20 wt % and about 40 wt %. each of the EML2 444 and the EML3 446 may comprise the fourth or sixth compound H2 or H3 between about 90 wt % and about 99 wt %, preferably about 95 wt % and 99 wt %, and comprise the fifth or seventh compound FD1 and FD2 between about 1 wt % and about 10 wt %, preferably about 1 wt % and 5 wt %.

In one exemplary aspect, when the EML2 444 is disposed adjacently to the EBL 465, the fourth compound H2 in the EML 444 may be the same material as the EBL 465. In this case, the EML2 444 may have an electron blocking function as well as an emission function. In other words, the EML2 444 can act as a buffer layer for blocking electrons. In one aspect, the EBL 465 may be omitted where the EML2 444 may be an electron blocking layer as well as an emitting material layer.

When the EML3 446 is disposed adjacently to the HBL 475, the sixth compound H3 in the EML3 446 may be the same material as the HBL 475. In this case, the EML3 446 may have a hole blocking function as well as an emission function. In other words, the EML3 446 can act as a buffer layer for blocking holes. In one aspect, the HBL 475 may be omitted where the EML3 446 may be a hole blocking layer as well as an emitting material layer.

In still another exemplary aspect, the fourth compound H2 in the EML2 444 may be the same material as the EBL 455 and the sixth compound H3 in the EML3 446 may be the same material as the HBL 475. In this aspect, the EML2 444 may have an electron blocking function as well as an emission function, and the EML3 446 may have a hole blocking function as well as an emission function. In other words, each of the EML2 444 and the EML3 446 can act as a buffer layer for blocking electrons or hole, respectively. In one aspect, the EBL 465 and the HBL 475 may be omitted where the EML2 444 may be an electron blocking layer as well as an emitting material layer and the EML3 446 may be a hole blocking layer as well as an emitting material layer.

Figure 10:
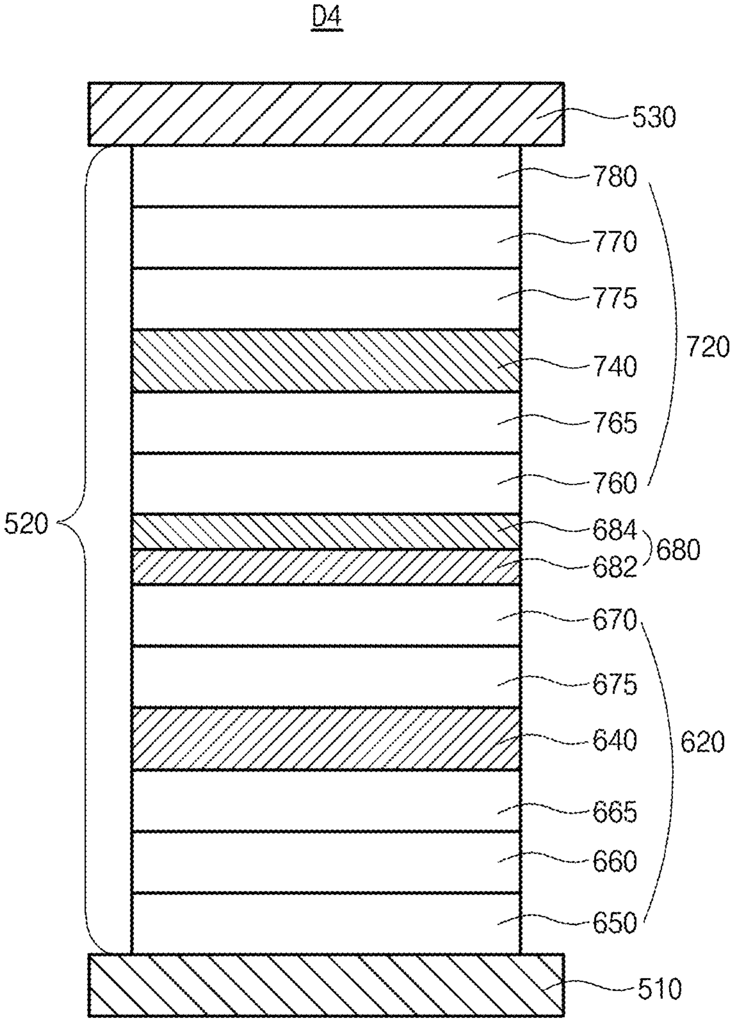
FIG. 10 is a schematic cross-sectional view illustrating an OLED in accordance with still another exemplary aspect of the present disclosure.

In an alternative aspect, an OLED may include multiple emitting parts. FIG. 10 is a schematic cross-sectional view illustrating an OLED in accordance with still another exemplary aspect of the present disclosure.

As illustrated in FIG. 10, the OLED D4 comprises first and second electrodes 510 and 530 facing each other and an emissive layer 520 with two emitting parts disposed between the first and second electrodes 510 and 530. The organic light emitting display device 100 (FIG. 1) includes a red pixel region, a green pixel region and a blue pixel region, and the OLED D4 may be disposed in the green pixel region. The first electrode 510 may be an anode and the second electrode 530 may be a cathode.

The emissive layer 520 includes a first emitting part 620 that includes a first EML (EML1) 640, and a second emitting part 720 that includes a second EML (EML2) 740. Also, the emissive layer 520 may further comprise a charge generation layer (CGL) 680 disposed between the first emitting part 620 and the second emitting part 720.

The CGL 680 is disposed between the first and second emitting parts 620 and 720 so that the first emitting part 620, the CGL 680 and the second emitting part 720 are sequentially disposed on the first electrode 510. In other words, the first emitting part 620 is disposed between the first electrode 510 and the CGL 680 and the second emitting part 720 is disposed between the second electrode 530 and the CGL 680.

The first emitting part 620 comprises the EML1 640. The first emitting part 620 may further comprise at least one of a first HTL (HTL1) 660 disposed between the first electrode 510 and the EML1 640, a HIL 650 disposed between the first electrode 510 and the HTL1 660 and a first ETL (ETL1) 670 disposed between the EML1 640 and the CGL 680. Alternatively, the first emitting part 620 may further comprise a first EBL (EBL1) 665 disposed between the HTL1 660 and the EML1 640 and/or a first HBL (HBL1) 675 disposed between the EML1 640 and the ETL 1 670.

The second emitting part 720 comprises the EML2 740. The second emitting part 720 may further comprise at least one of a second HTL (HTL2) 760 disposed between the CGL 680 and the EML2 740, a second ETL (ETL2) 770 disposed between the EML2 740 and the second electrode 530 and an EIL 780 disposed between the ETL2 770 and the second electrode 530. Alternatively, the second emitting part 720 may further comprise a second EBL (EBL2) 765 disposed between the HTL2 760 and the EML2 740 and/or a second HBL (HBL2) 775 disposed between the EML2 740 and the ETL2 770.

The CGL 680 is disposed between the first emitting part 620 and the second emitting part 720. The first emitting part 620 and the second emitting part 720 are connected via the CGL 680. The CGL 680 may be a PN-junction CGL that junctions an N-type CGL (N-CGL) 682 with a P-type CGL (P-CGL) 684.

The N-CGL 682 is disposed between the ETL1 670 and the HTL2 760 and the P-CGL 684 is disposed between the N-CGL 682 and the HTL2 760. The N-CGL 682 transports electrons to the EML1 640 of the first emitting part 620 and the P-CGL 684 transport holes to the EML2 740 of the second emitting part 720.

In this aspect, each of the EML1 640 and the EML2 740 may be a green emitting material layer. For example, at least one of the EML1 640 and the EML2 740 comprise a first compound of a host, a second compound of delayed fluorescent material and a third compound of fluorescent material.

When the EML1 640 includes the first compound, the second compound and the third compound, the contents of the first compound may be larger than the contents of the second compound, and the contents of the second compound is larger than the contents of the third compound. In this case, exciton energy can be transferred efficiently from the second compound to the third compound. As an example, each of the contents of the first to third compounds in the EML1 640 may be, but is not limited to, about 60 wt % to about 75 wt %, about 20 wt % to about 40 wt % and about 0.1 wt % to about 5 wt %, respectively.

In one exemplary aspect, the EML2 740 may comprise the first compound of a host, the second compound of delayed fluorescent material and the third compound of fluorescent material similar to the EML1 640. Alternatively, the EML2 740 may include another compound that is different from at least one of the second compound and the third compound in the EML1 640, and thus the EML2 740 may emit light different from the light emitted from the EML1 640 or may have different luminous efficiency different from the luminous efficiency of the EML1 640.

In FIG. 10, each of the EML1 640 and the EML2 740 has a single-layered structure. Alternatively, each of the EML1 640 and the EML2 740, each of which may include the first to third compounds, may have a double-layered structure (FIG. 6) or a triple-layered structure (FIG. 8), respectively.

In the OLED D4, the singlet exciton energy of the second compound of delayed fluorescent material is transferred to the third compound of fluorescent material, and the final emission is occurred at the third compound. Accordingly, the OLED D4 can have excellent luminous efficiency and color purity. In addition, the OLED D4 has a double stack structure of a green emitting material layer, the OLE4 D5 improve its color sense or optimize its luminous efficiency.

Figure 11:
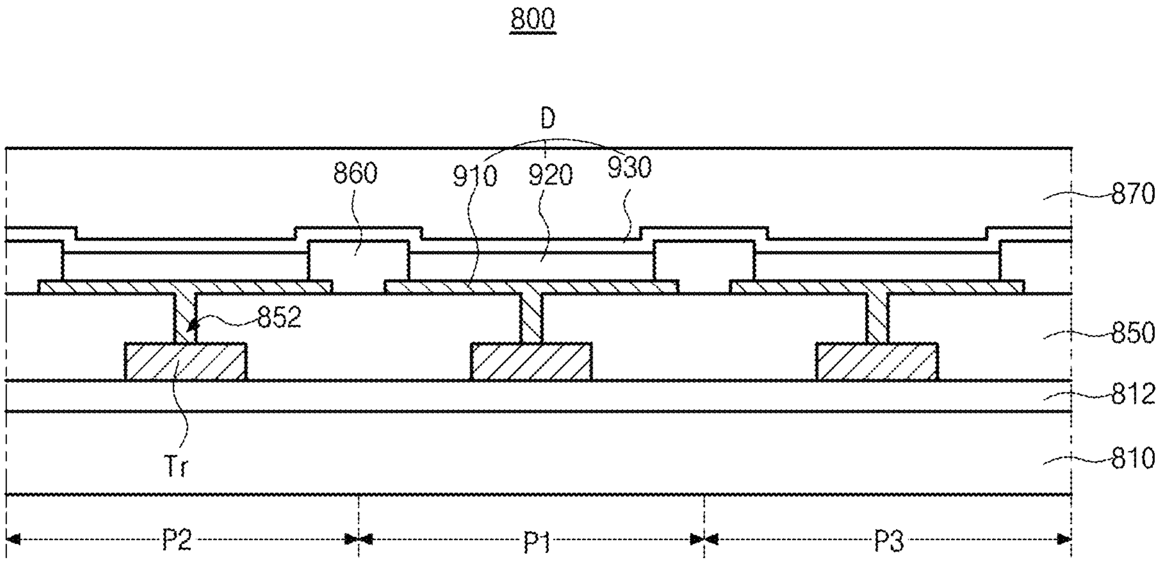
FIG. 11 is a schematic cross-sectional view illustrating an organic light emitting display device in accordance with another exemplary aspect of the present disclosure.

FIG. 11 is a schematic cross-sectional view illustrating an organic light emitting display device in accordance with another exemplary aspect of the present disclosure. As illustrated in FIG. 11, an organic light emitting display device 800 includes a substrate 810 that defines first to third pixel regions P1, P2 and P3, a thin film transistor Tr disposed over the substrate 810 and an OLED D disposed over the thin film transistor Tr and connected to the thin film transistor Tr. As an example, the first pixel region P1 may be a green pixel region, the second piex region P2 may be a red pixel region and the third pixel region P3 may be a blue pixel region.

The substrate 810 may be a glass substrate or a flexible substrate. For example, the flexible substrate may be any one of a PI substrate, a PES substrate, a PEN substrate, a PET substrate and a PC substrate.

A buffer layer 812 is disposed over the substrate 810 and the thin film transistor Tr is disposed over the buffer layer 812. The buffer layer 812 may be omitted. As illustrated in FIG. 1, the thin film transistor Tr includes a semiconductor layer, a gate electrode, a source electrode and a drain electrode and acts as a driving element.

A passivation layer 850 is disposed over the thin film transistor Tr. The passivation layer 850 has a flat top surface and a drain contact hole 852 that exposes a drain electrode of the thin film transistor Tr.

The OLED D is disposed over the passivation layer 850, and includes a first electrode 910 that is connected to the drain electrode of the thin film transistor Tr, and an emissive layer 920 and a second electrode 930 each of which is disposed sequentially on the first electrode 910. The OLED D is disposed in each of the first to third pixel regions P1, P2 and P3 and emits different light in each pixel region. For example, the OLED D in the first pixel region P1 may emit green light, the OLED D in the second pixel region P2 may emit red light and the OLED D in the third pixel region P3 may emit blue light.

The first electrode 910 is separately formed for each of the first to third pixel regions P1, P2 and P3, and the second electrode 930 corresponds to the first to third pixel regions P1, P2 and P3 and is formed integrally.

The first electrode 910 may be one of an anode and a cathode, and the second electrode 930 may be the other of the anode and the cathode. In addition, one of the first electrode 910 and the second electrode 930 is a transmissive (or semi-transmissive) electrode and the other of the first electrode 910 and the second electrode 930 is a reflective electrode.

For example, the first electrode 910 may be an anode and may include conductive material having a relatively high work function value, i.e., a transparent conductive oxide layer of transparent conductive oxide (TCO). The second electrode 930 may be a cathode and may include conductive material having relatively low work function value, i.e., a metal material layer of low-resistant metal. For example, the first electrode 910 may include any one of ITO, IZO, ITZO, SnO, ZnO, ICO and AZO, and the second electrode 930 may include Al, Mg, Ca, Ag, alloy thereof or combination thereof.

When the organic light emitting display device 800 is a bottom-emission type, the first electrode 910 may have a single-layered structure of a transparent conductive oxide layer.

Alternatively, when the organic light emitting display device 800 is a top-emission type, a reflective electrode or a reflective layer may be disposed under the first electrode 910. For example, the reflective electrode or the reflective layer may include, but is not limited to, Ag or APC alloy. In the OLED D of the top-emission type, the first electrode 910 may have a triple-layered structure of ITO/Ag/ITO or ITO/APC/ITO. Also, the second electrode 930 is thin so as to have light-transmissive (or semi-transmissive) property.

A bank layer 860 is disposed on the passivation layer 850 in order to cover edges of the first electrode 910. The bank layer 860 corresponds to each of the first to third pixel regions P1, P2 and P3 and exposes a center of the first electrode 910.

An emissive layer 920 is disposed on the first electrode 910. In one exemplary aspect, the emissive layer 920 may have a single-layered structure of an EML. Alternatively, the emissive layer 920 may include at least one of a HIL, a HTL, and an EBL disposed sequentially between the first electrode 910 and the EML and/or a HBL, an ETL and an EIL disposed sequentially between the EML and the second electrode 930.

In one exemplary aspect, the EML of the emissive layer 930 in the first pixel region P1 of a green pixel region may comprise a first compound of a host, a second compound of delayed fluorescent material having the structure of Chemical Formulae 1 to 2 and a third compound of fluorescent material having the structure of Chemical Formulae 3 to 4.

An encapsulation film 870 is disposed over the second electrode 930 in order to prevent outer moisture from penetrating into the OLED D. The encapsulation film 870 may have, but is not limited to, a triple-layered structure of a first inorganic insulating film, an organic insulating film and a second inorganic insulating film.

The organic light emitting display device 800 may have a polarizer in order to decrease external light reflection. For example, the polarizer may be a circular polarizer. When the organic light emitting display device 800 is a bottom-emission type, the polarizer may be disposed under the substrate 810. Alternatively, when the organic light emitting display device 800 is a top emission type, the polarizer may be disposed over the encapsulation film 870.

Figure 12:
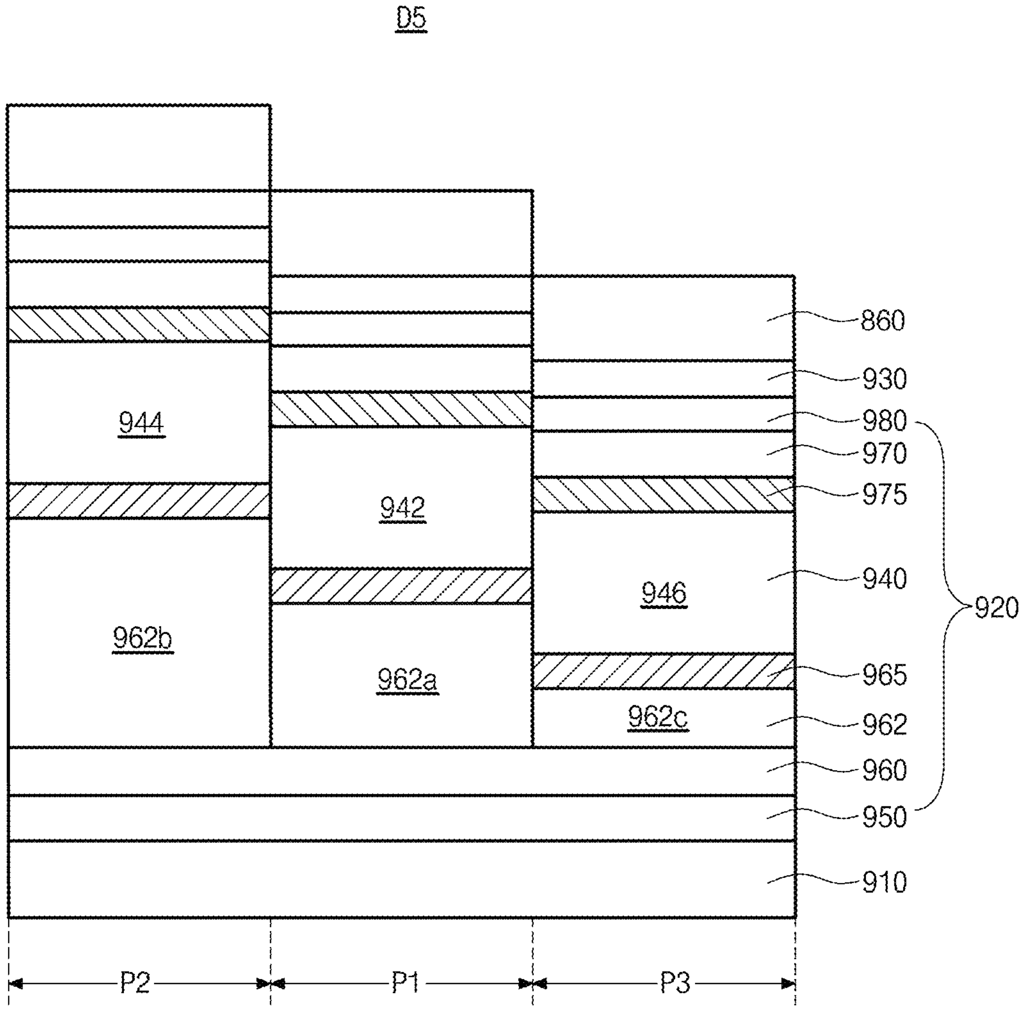
FIG. 12 is a schematic cross-sectional view illustrating an OLED in accordance with still another exemplary aspect of the present disclosure.

FIG. 12 is a schematic cross-sectional view illustrating an OLED in accordance with still another exemplary aspect of the present disclosure. As illustrated in FIG. 12, the OLED D5 comprises a first electrode 910, a second electrode 930 facing the first electrode 910 and an emissive layer 920 disposed between the first and second electrodes 910 and 930.

The first electrode 910 may be an anode and the second electrode 930 may be a cathode. As an example, the first electrode 910 may be a reflective electrode and the second electrode 930 may be a transmissive (or semi-transmissive) electrode.

The emissive layer 920 comprises an EML 940. The emissive layer 930 may comprise at least one of a HTL 960 disposed between the first electrode 910 and the EML 940 and an ETL 970 disposed between the second electrode 930 and the EML 940. Also, the emissive layer 920 may further comprise at least one of a HIL 950 disposed between the first electrode 910 and the HTL 960 and an EIL 980 disposed between the second electrode 930 and the ETL 970. Alternatively, the emissive layer 920 may further comprise an EBL 965 disposed between the HTL 960 and the EML 940 and/or a HBL 975 disposed between the EML 940 and the ETL 970.

In addition, the emissive layer 920 may further comprise an auxiliary hole transport layer (auxiliary HTL) 962 disposed between the HTL 960 and the EBL 965. The auxiliary HTL 962 may comprise a first auxiliary HTL 962*a* located in the first pixel region P1, a second auxiliary HTL 962*b* located in the second pixel region P2 and a third auxiliary HTL 962*c* located in the third pixel region P3.

The first auxiliary HTL 962*a* has a first thickness, the second auxiliary HTL 962*b* has a second thickness and the third auxiliary HTL 962*c* has a third thickness. The first thickness is less than the second thickness and is more than the third thickness. Accordingly, the OLED D5 has a micro-cavity structure.

Owing to the first to third auxiliary HTLs 962*a*, 962*b* and 962*c* having different thickness to each other, the distance between the first electrode 910 and the second electrode 930 in the first pixel region P1 emitting light in the first wavelength range (green light) is smaller than the distance between the first electrode 910 and the second electrode 930 in the second pixel region P2 emitting light in the second wavelength (red light), which is longer than the first wave length range, while the distance between the first electrode 910 and the second electrode 930 in the first pixel region P1 is larger than the distance between the first electrode 910 and the second electrode 930 in the third pixel region P3 emitting light in the third wavelength range (blue light), which is shorter than the first wavelength range. Accordingly, the OLED D5 has improved luminous efficiency.

In FIG. 12, the third auxiliary HTL 962*c* is located in the third pixel region P3. Alternatively, the OLED D5 may implement the micro-cavity structure without the third auxiliary HTL 962*c*. In addition, a capping layer may be disposed over the second electrode in order to improve out-coupling of the light emitted from the OLED D5.

The EML 940 comprises a first EML (EML1) 942 located in the first pixel region P1, a second EML (EML2) 944 located in the second pixel region P2 and a third EML (EML3) 946 located in the third pixel region P3. Each of the EML1 942, the EML2 944 and the EML3 946 may be a green EML, a red EML and a blue EML, respectively.

In one exemplary aspect, the EML1 942 located in the first pixel region P1 may comprise a first compound f a host, a second compound of delayed fluorescent material having the structure of Chemical Formulae 1 to 2 and a third compound of fluorescent material having the structure of Chemical Formulae 3 to 4. In this case, the EML1 942 may have a single-layered structure, a double-layered structure (FIG. 6) or a triple-layered structure (FIG. 8).

When the EML1 942 includes the first compound, the second compound and the third compound, the contents of the first compound may be larger than the contents of the second compound, and the contents of the second compound is larger than the contents of the third compound. In this case, exciton energy can be transferred efficiently from the second compound to the third compound As an example, each of the contents of the first to third compounds in each of the EML1 942 may be, but is not limited to, about 60 wt % to about 75 wt %, about 20 wt % to about 40 wt % and about 0.1 wt % to about 5 wt %, respectively.

The EML2 944 located in the second pixel region P2 may comprise a host and red dopant and the EML3 946 located in the third pixel region P3 may comprise a host and blue dopant. For example, the host in the EML2 944 and the EML3 946 may comprise the first compound, and each of the red dopant and the blue dopant may comprise at least one of red or blue phosphorescent material, red or blue fluorescent material and red or blue delayed fluorescent material.

The OLED D5 emits green light, red light and blue light in each of the first to third pixel regions P1, P2 and P3 so that the organic light emitting display device 800 (FIG. 12) may implement a full-color image.

The organic light emitting display device 800 may further comprise a color filter layer corresponding to the first to third pixel regions P1, P2 and P3 for improving color purity of the light emitted from the OLED D. As an example, the color filter layer may comprise a first color filter layer (green color filter layer) corresponding to the first pixel region P1, the second color filter layer (red color filter layer) corresponding to the second pixel region P2 and the third color filter layer (blue color filter layer) corresponding to the third pixel region P3.

When the organic light emitting display device 800 is a bottom-emission type, the color filter layer may be disposed between the OLED D and the substrate 810. Alternatively, when the organic light emitting display device 800 is a top-emission type, the color filter layer may be disposed over the OLED D.

Figure 13:
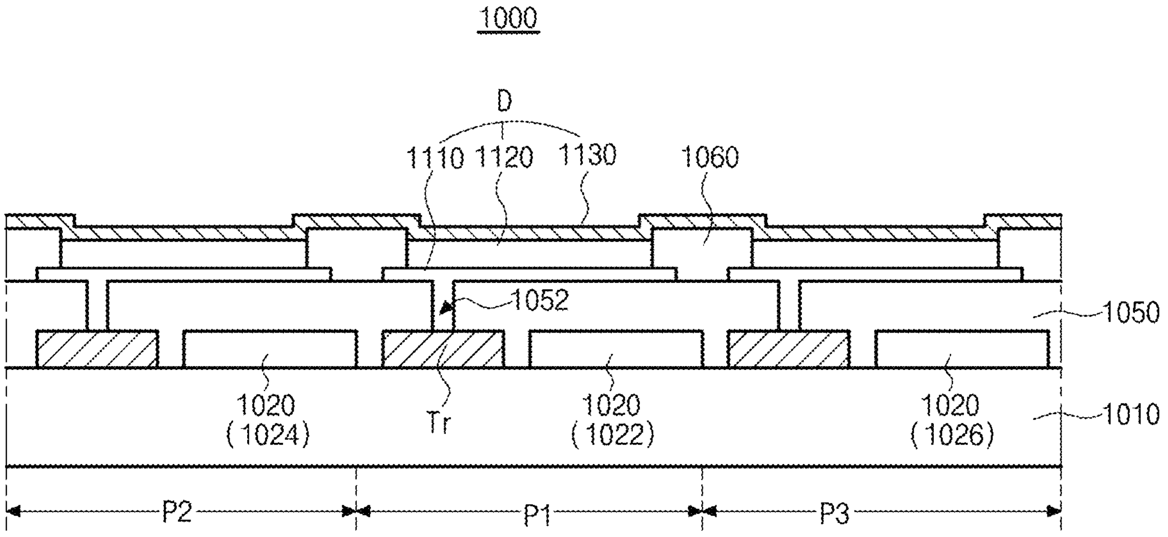
FIG. 13 is a schematic cross-sectional view illustrating an organic light emitting display device in accordance with still another exemplary aspect of the present disclosure.

FIG. 13 is a schematic cross-sectional view illustrating an organic light emitting display device in accordance with still another exemplary aspect of the present disclosure. As illustrated in FIG. 13, the organic light emitting display device 1000 comprise a substrate 1010 defining a first pixel region P1, a second pixel region P2 and a third pixel region P3, a thin film transistor Tr disposed over the substrate 1010, an OLED D disposed over the thin film transistor Tr and connected to the thin film transistor Tr and a color filter layer 1020 corresponding to the first to third pixel regions P1, P2 and P3. As an example, the first pixel region P1 may be a green pixel region, the second pixel region P2 may be a red pixel region and the third pixel region P3 may be a green pixel region.

The substrate 1010 may be a glass substrate or a flexible substrate. For example, the flexible substrate may be any one of a PI substrate, a PES substrate, a PEN substrate, a PET substrate and a PC substrate. The thin film transistor Tr is located over the substrate 1010. Alternatively, a buffer layer may be disposed over the substrate 1010 and the thin film transistor Tr may be disposed over the buffer layer. As illustrated in FIG. 1, the thin film transistor Tr includes a semiconductor layer, a gate electrode, a source electrode and a drain electrode and acts as a driving element.

The color filter layer 1020 is located over the substrate 1010. As an example, the color filter layer 1020 may comprise a first color filter layer 1022 corresponding to the first pixel region P1, a second color filter layer 1024 corresponding to the second pixel region P2 and a third color filter layer 1026 corresponding to the third pixel region P3. The first color filter layer 1022 may be a green color filter layer, the second color filter layer 1024 may be a red color filter layer and the third color filter layer 1026 may be a blue color filter layer. For example, the first color filter layer 1022 may comprise at least one of green dye or green pigment, the second color filter layer 1024 may comprise at least one of red dye or red pigment and the third color filter layer 1026 may comprise at least one of blue dye or blue pigment.

A passivation layer 1050 is disposed over the thin film transistor Tr and the color filter layer 1020. The passivation layer 1050 has a flat top surface and a drain contact hole 1052 that exposes a drain electrode of the thin film transistor Tr.

The OLED D is disposed over the passivation layer 1050 and corresponds to the color filter layer 1020. The OLED D includes a first electrode 1110 that is connected to the drain electrode of the thin film transistor Tr, and an emissive layer 1120 and a second electrode 1130 each of which is disposed sequentially on the first electrode 1110. The OLED D emits white light in the first to third pixel regions P1, P2 and P3.

The first electrode 1110 is separately formed for each of the first to third pixel regions P1, P2 and P3, and the second electrode 1130 corresponds to the first to third pixel regions P1, P2 and P3 and is formed integrally.

The first electrode 1110 may be one of an anode and a cathode, and the second electrode 1130 may be the other of the anode and the cathode. In addition, the first electrode 1110 may be a transmissive (or semi-transmissive) electrode and the second electrode 1130 may be a reflective electrode.

For example, the first electrode 1110 may be an anode and may include conductive material having a relatively high work function value, i.e., a transparent conductive oxide layer of transparent conductive oxide (TCO). The second electrode 1130 may be a cathode and may include conductive material having relatively low work function value, i.e., a metal material layer of low-resistant metal. For example, the transparent conductive oxide layer of the first electrode 1110 may include any one of ITO, IZO, ITZO, SnO, ZnO, ICO and AZO, and the second electrode 1130 may include Al, Mg, Ca, Ag, alloy thereof (ex., Mg—Ag) or combination thereof.

The emissive layer 1120 is disposed on the first electrode 1110. The emissive layer 1120 includes at least two emitting parts emitting different colors. Each of the emitting part may have a single-layered structure of an EML. Alternatively, each of the emitting parts may include at least one of a HIL, a HTL, and an EBL, a HBL, an ETL and an EIL. In addition, the emissive layer 1120 may further comprise a CGL disposed between the emitting parts.

At least one of the at least two emitting parts may comprise a first compound of a host, a second compound of delayed fluorescent material having the structure of Chemical Formulae 1 to 2 and a third compound of fluorescent material having the structure of Chemical Formulae 3 to 4.

A bank layer 1060 is disposed on passivation layer 1050 in order to cover edges of the first electrode 1110. The bank layer 1060 corresponds to each of the first to third pixel regions P1, P2 and P3 and exposes a center of the first electrode 1110. As described above, since the OLED D emits white light in the first to third pixel regions P1, P2 and P3, the emissive layer 1120 may be formed as a common layer without being separated in the first to third pixel regions P1, P2 and P3. The bank layer 1060 is formed to prevent current leakage from the edges of the first electrode 1110, and the bank layer 1060 may be omitted.

Moreover, the organic light emitting display device 1000 may further comprise an encapsulation film disposed on the second electrode 1130 in order to prevent outer moisture from penetrating into the OLED D. In addition, the organic light emitting display device 1000 may further comprise a polarizer disposed under the substrate 1010 in order to decrease external light reflection.

In the organic light emitting display device 1000 in FIG. 13, the first electrode 1110 is a transmissive electrode, the second electrode 1130 is a reflective electrode, and the color filter layer 1020 is disposed between the substrate 1010 and the OLED D. That is, the organic light emitting display device 1000 is a bottom-emission type. Alternatively, the first electrode 1110 may be a reflective electrode, the second electrode 1120 may be a transmissive electrode (or semi-transmissive electrode) and the color filter layer 1020 may be disposed over the OLED D in the organic light emitting display device 1000.

In the organic light emitting display device 1000, the OLED D located in the first to third pixel regions P1, P2 and P3 emits white light, and the white light passes through each of the first to third pixel regions P1, P2 and P3 so that each of a green color, a red color and a blue color is displayed in the first to third pixel regions P1, P2 and P3, respectively.

A color conversion film may be disposed between the OLED D and the color filter layer 1020. The color conversion film corresponds to the first to third pixel regions P1, P2 and P3, and comprises a green color conversion film, a red color conversion film and a blue color conversion film each of which can convert the white light emitted from the OLED D into green light, red light and blue light, respectively. For example, the color conversion film may comprise quantum dots. Accordingly, the organic light emitting display device 1000 may further enhance its color purity. Alternatively, the color conversion film may displace the color filter layer 1020.

Figure 14:
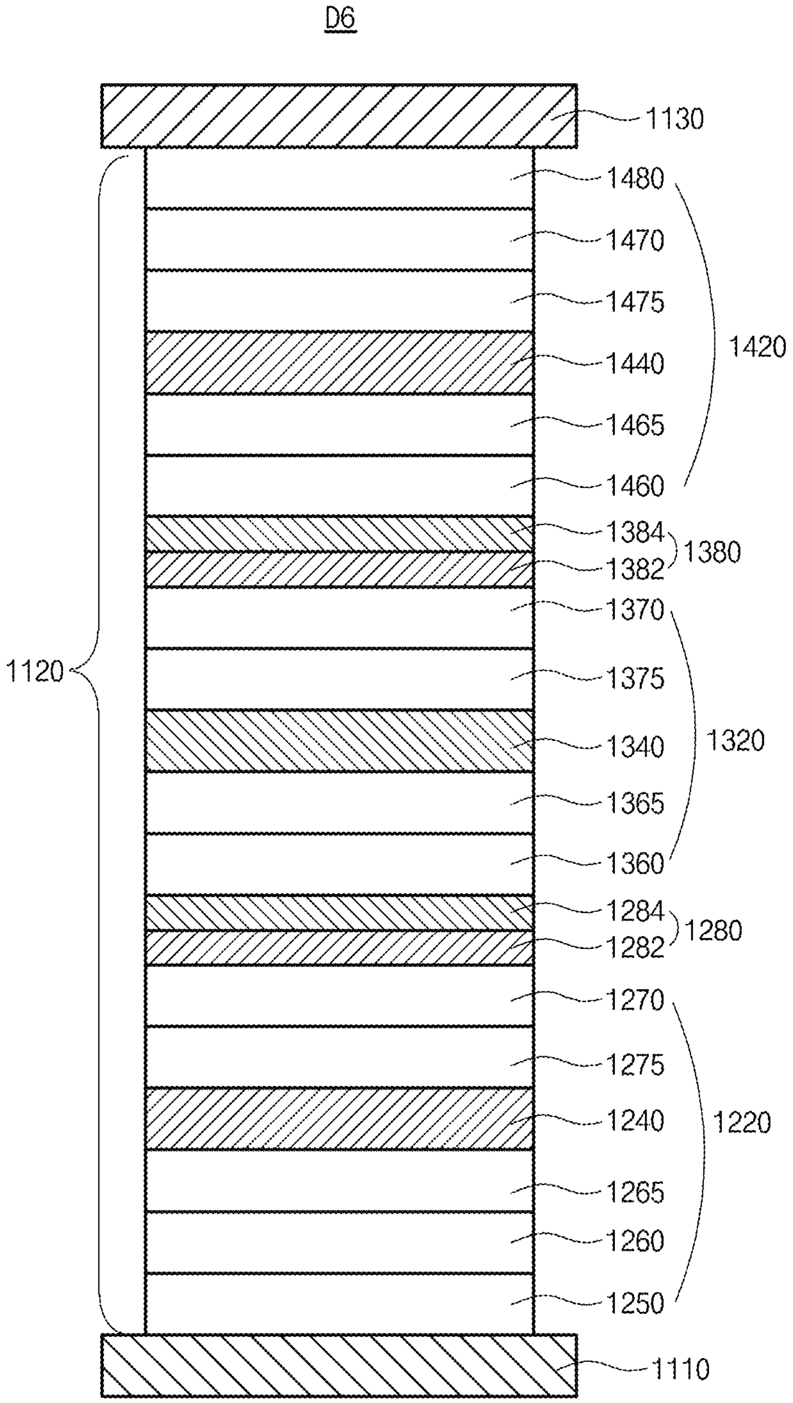
FIG. 14 is a schematic cross-sectional view illustrating an OLED in accordance with still another exemplary aspect of the present disclosure.

FIG. 14 is a schematic cross-sectional view illustrating an OLED in accordance with still another exemplary aspect of the present disclosure. As illustrated in FIG. 14, the OLED D6 comprises first and second electrodes 1110 and 1120 facing each other and an emissive layer 1120 disposed between the first and second electrodes 1110 and 1120. The first electrode 1110 may be an anode and the second electrode 1120 may be a cathode. For example, the first electrode 1100 may be a transmissive electrode and the second electrode 1120 may be a reflective electrode.

The emissive layer 1120 includes a first emitting part 1220 comprising a first EML (EML1) 1240, a second emitting part 1320 comprising a second EML (EML2) 1340 and a third emitting part 1420 comprising a third EML (EML3) 1440. In addition, the emissive layer 1120 may further comprise a first charge generation layer (CGL1) 1280 disposed between the first emitting part 1220 and the second emitting part 1320 and a second charge generation layer (CGL2) 1380 disposed between the second emitting part 1320 and the third emitting part 1420. Accordingly, the first emitting part 1220, the CGL1 1280, the second emitting part 1320, the CGL2 1380 and the third emitting part 1420 are disposed sequentially on the first electrode 1110.

The first emitting part 1220 may further comprise at least one of a first HTL (HTL1) 1260 disposed between the first electrode 1110 and the EML1 1240, a HIL 1250 disposed between the first electrode 1110 and the HTL1 1260 and a first ETL (ETL1) 1270 disposed between the EML1 1240 and the CGL1 1280. Alternatively, the first emitting part 1220 may further comprise a first EBL (EBL1) 1265 disposed between the HTL1 1260 and the EML1 1240 and/or a first HBL (HBL1) 1275 disposed between the EML1 1240 and the ETL1 1270.

The second emitting part 1320 may further comprise at least one of a second HTL (HTL2) 1360 disposed between the CGL1 1280 and the EML2 1340, a second ETL (ETL2) 1370 disposed between the EML2 1340 and the CGL2 1380. Alternatively, the second emitting part 1320 may further comprise a second EBL (EBL2) 1365 disposed between the HTL2 1360 and the EML2 1340 and/or a second HBL (HBL2) 1375 disposed between the EML2 1340 and the ETL2 1370.

The third emitting part 1420 may further comprise at least one of a third HTL (HTL3) 1460 disposed between the CGL2 1380 and the EML3 1440, a third ETL (ETL3) 1470 disposed between the EML3 1440 and the second electrode 1130 and an EIL 1480 disposed between the ETL3 1470 and the second electrode 1130. Alternatively, the third emitting part 1420 may further comprise a third EBL (EBL3) 1465 disposed between the HTL3 1460 and the EML3 1440 and/or a third HBL (HBL3) 1475 disposed between the EML3 1440 and the ETL3 1470.

The CGL1 1280 is disposed between the first emitting part 1220 and the second emitting part 1320. That is, the first emitting part 1220 and the second emitting part 1320 are connected via the CGL1 1280. The CGL1 1280 may be a PN-junction CGL that junctions a first N-type CGL (N-CGL1) 1282 with a first P-type CGL (P-CGL1) 1284.

The N-CGL1 1282 is disposed between the ETL1 1270 and the HTL2 1360 and the P-CGL1 1284 is disposed between the N-CGL1 1282 and the HTL2 1360. The N-CGL1 1282 transports electrons to the EML1 1240 of the first emitting part 1220 and the P-CGL1 1284 transport holes to the EML2 1340 of the second emitting part 1320.

The CGL2 1380 is disposed between the second emitting part 1320 and the third emitting part 1420. That is, the second emitting part 1320 and the third emitting part 1420 are connected via the CGL2 1380. The CGL2 1380 may be a PN-junction CGL that junctions a second N-type CGL (N-CGL2) 1382 with a second P-type CGL (P-CGL2) 1384.

The N-CGL2 1382 is disposed between the ETL2 1370 and the HTL3 1460 and the P-CGL2 1384 is disposed between the N-CGL2 1382 and the HTL3 1460. The N-CGL2 1382 transports electrons to the EML2 1340 of the second emitting part 1320 and the P-CGL2 1384 transport holes to the EML3 1440 of the third emitting part 1420.

In this aspect, one of the first to third EMLs 1240, 1340 and 1440 may be a blue EML, another of the first to third EMLs 1240, 1340 and 1440 may be a green EML and the third of the first to third EMLs 1240, 1340 and 1440 may be a red EML.

As an example, the EML1 1240 may be a blue EML, the EML2 1340 may be a green EML and the EML3 1440 may be a red EML. Alternatively, the EML1 1240 may be a red EML, the EML2 1340 may be a green EML and the EML3 1440 may be a blue EML1. As described below, at least one of the EML1 1240, the EML2 1340 and the EML3 1440 may comprise a first compound H, a second compound TD and/or a third compound FD. The EMLs 1240, 1340 and 1440 including the first to third compounds may have a single-layered structure, a double-layered structure or a triple-layered structure.

The EML1 1240 may comprise a host and blue dopant (or red dopant) and the EML3 1340 may comprises a host and red dopant (or blue dopant). As an example, the host in each of the EML1 1240 and the EML3 1440 may comprise the first compound, the blue or red dopant in each of the EML1 1240 and the EML3 1440 may comprise at least one of blue or red phosphorescent material, blue or red fluorescent material and blue or red delayed fluorescent material, respectively.

The EML2 1340 may comprise a first compound of a host, a second compound of delayed fluorescent material having the structure of Chemical Formulae 1 to 2, and a third compound of fluorescent material having the structure of Chemical Formulae 3 to 4. The EML2 1340 including the first to third compounds may have a single-layered structure, a double-layered structure of a triple-layered structure.

When the EML2 1340 includes the first compound the second compound and the third compound, the contents of the first compound may be larger than the contents of the second compound, and the contents of the second compound is larger than the contents of the third compound. In this case, exciton energy can be transferred efficiently from the second compound to the third compound. As an example, each of the contents of the first to third compounds in the EML2 1340 may be, but is not limited to, about 60 wt % to about 75 wt %, about 20 wt % to about 40 wt % and about 0.1 wt % to about 5 wt %, respectively.

The OLED D6 emits white light in each of the first to third pixel regions P1, P2 and P3 and the white light passes though the color filter layer 1020 (FIG. 13) correspondingly disposed in the first to third pixel regions P1, P2 and P3. Accordingly, the OLED D6 can implement a full-color image.

Figure 15:
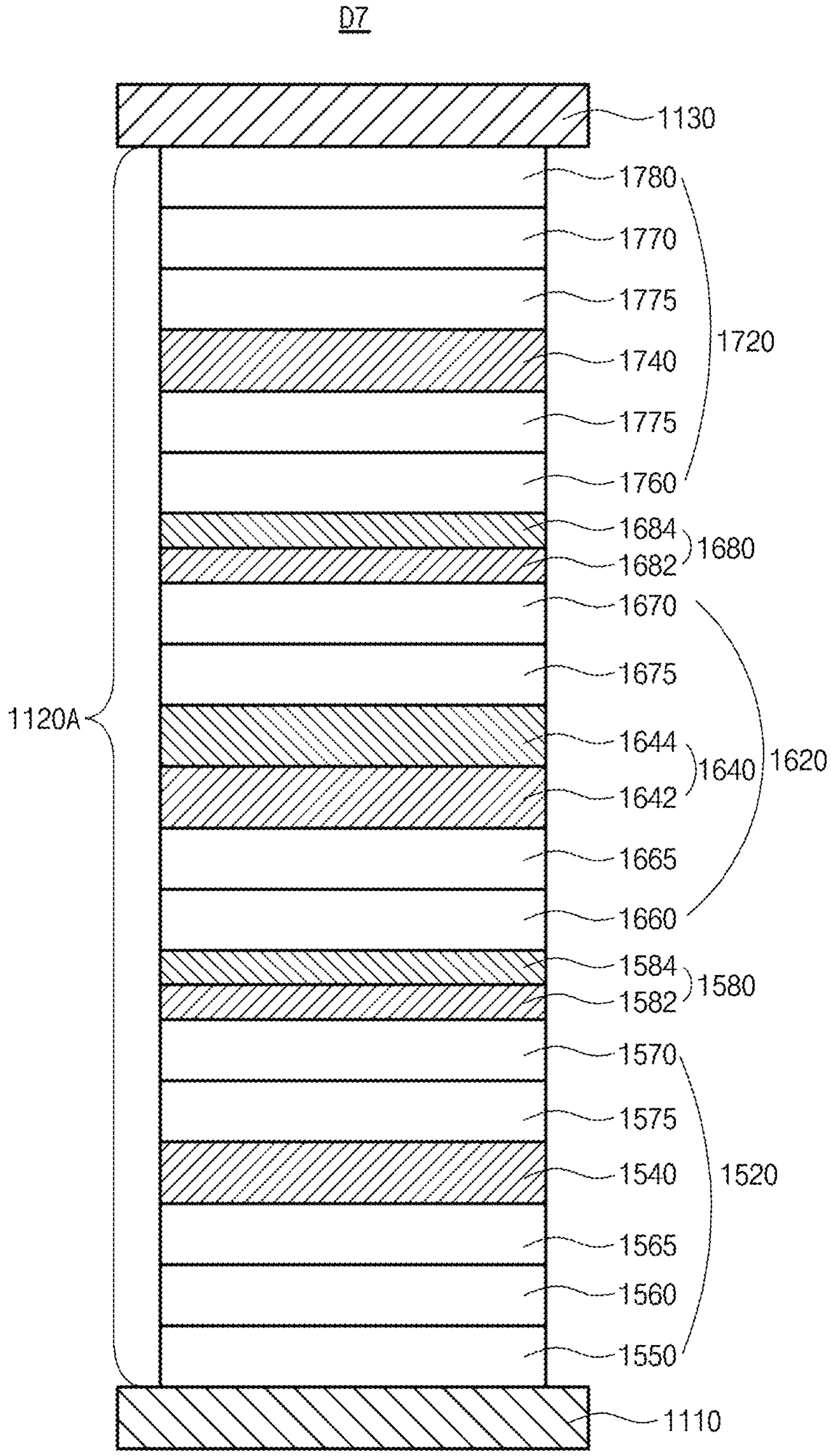
FIG. 15 is a schematic cross-sectional view illustrating an OLED in accordance with still another exemplary aspect of the present disclosure.

FIG. 15 is a schematic cross-sectional view illustrating an OLED in accordance with still another exemplary aspect of the present disclosure. As illustrated in FIG. 15, the OLED D7 comprises first and second electrodes 1110 and 1120 facing each other and an emissive layer 1120A disposed between the first and second electrodes 1110 and 1120. The first electrode 1110 may be an anode and the second electrode 1120 may be a cathode. For example, the first electrode 1100 may be a transmissive electrode and the second electrode 1120 may be a reflective electrode.

The emissive layer 1120A includes a first emitting part 1520 comprising an EML1 1540, a second emitting part 1620 comprising an EML2 1640 and a third emitting part 1720 comprising a EML3 1740. In addition, the emissive layer 1120A may further comprise a CGL1 1580 disposed between the first emitting part 1520 and the second emitting part 1620 and a CGL2 1680 disposed between the second emitting part 1620 and the third emitting part 1720. Accordingly, the first emitting part 1520, the CGL1 1580, the second emitting part 1620, the CGL2 1680 and the third emitting part 1720 are disposed sequentially on the first electrode 1110.

The first emitting part 1520 may further comprise at least one of a HTL1 1560 disposed between the first electrode 1110 and the EML1 1540, a HIL 1550 disposed between the first electrode 1110 and the HTL1 1560 and an ETL1 1570 disposed between the EML1 1540 and the CGL1 1580. Alternatively, the first emitting part 1520 may further comprise an EBL1 1565 disposed between the HTL1 1560 and the EML1 1540 and/or a HBL1 1575 disposed between the EML1 1540 and the ETL1 1570.

The EML2 1640 of the second emitting part 1620 comprises a lower EML 1642 and an upper EML 1644. The lower EML 1642 is located adjacently to the first electrode 1110 and the upper EML 1644 is located adjacently to the second electrode 1130. In addition, the second emitting part 1620 may further comprise at least one of a HTL2 1660 disposed between the CGL1 1580 and the EML2 1640, an ETL2 1670 disposed between the EML2 1640 and the CGL2 1680. Alternatively, the second emitting part 1620 may further comprise an EBL2 1665 disposed between the HTL2 1660 and the EML2 1640 and/or a HBL2 1675 disposed between the EML2 1640 and the ETL2 1670.

The third emitting part 1720 may further comprise at least one of a HTL3 1760 disposed between the CGL2 1680 and the EML3 1740, an ETL3 1770 disposed between the EML3 1740 and the second electrode 1130 and an EIL 1780 disposed between the ETL3 1770 and the second electrode 1130. Alternatively, the third emitting part 1720 may further comprise an EBL3 1765 disposed between the HTL3 1760 and the EML3 1740 and/or a HBL3 1775 disposed between the EML3 1740 and the ETL3 1770.

The CGL1 1380 is disposed between the first emitting part 1520 and the second emitting part 1620. That is, the first emitting part 1520 and the second emitting part 1620 are connected via the CGL1 1580. The CGL1 1580 may be a PN-junction CGL that junctions an N-CGL1 1582 with a P-CGL1 1584. The N-CGL1 1582 is disposed between the ETL1 1570 and the HTL2 1660 and the P-CGL1 1584 is disposed between the N-CGL1 1582 and the HTL2 1560.

The CGL2 1680 is disposed between the second emitting part 1620 and the third emitting part 1720. That is, the second emitting part 1620 and the third emitting part 1720 are connected via the CGL2 1680. The CGL2 1680 may be a PN-junction CGL that junctions an N-CGL2 1682 with a P-CGL2 1684. The N-CGL2 1682 is disposed between the ETL2 1570 and the HTL3 1760 and the P-CGL2 1684 is disposed between the N-CGL2 1682 and the HTL3 1760. In one exemplary aspect, at least one of the N-CGL1 1582 and the N-CGL2 1682 may include any organic compound having the structure of Chemical Formulae 1 to 3.

In this aspect, each of the EML1 1540 and the EML3 1740 may be a blue EML. Each of the EML1 1540 and the EML3 1740 may comprise a host and blue dopant, respectively. The host may comprise the first compound and blue dopant may comprise at least one of blue phosphorescent material, blue fluorescent material and blue delayed fluorescent material. At least one of the host and the blue dopant in the EML1 1540 may be identical to or different from at least one of the host and the blue dopant in the EML3 1740. As an example, the blue dopant in the EML1 1540 may be different from the dopant in the EML3 1740 in terms of luminous efficiency and/or emission wavelength.

One of the lower EML 1642 and the upper EML 1644 in the EML2 1640 may be a green EML and the other of the lower EML 1642 and the upper EML 1644 in the EML2 1640 may be a red EML. The green EML and the red EML is sequentially disposed to form the EML2 1640.

In one exemplary aspect, the lower EML 1642 as the green EML may comprise a first compound of a host, and a second compound of delayed fluorescent material having the structure of Chemical Formulae 1 to 2 and a third compound of fluorescent material having the structure of Chemical Formulae 1 to 2.

In addition, the upper EML 1644 as the red EML may comprise a host and red dopant. The host in the upper EML 1644 may comprise the first compound and the red dopant may comprise at least one of red phosphorescent material, red fluorescent material and red delayed fluorescent material.

For example, when the lower EML 1642 includes the first compound, the second compound and the third compound, the contents of the first compound may be larger than the contents of the second compound, and the contents of the second compound is larger than the contents of the third compound. In this case, exciton energy can be transferred efficiently from the second compound to the third compound. As an example, each of the contents of the first to third compounds in the lower EML 1642 may be, but is not limited to, about 60 wt % to about 75 wt %, about 20 wt % to about 40 wt % and about 0.1 wt % to about 5 wt %, respectively.

The OLED D7 emits white light in each of the first to third pixel regions P1, P2 and P3 and the white light passes though the color filter layer 1020 (FIG. 13) correspondingly disposed in the first to third pixel regions P1, P2 and P3. Accordingly, the organic light emitting display device 1000 (FIG. 13) can implement a full-color image.

In FIG. 15, the OLED D7 has a three-stack structure including the first to three emitting parts 1520, 1620 and 1720 which includes the EML1 1540 and the EML3 1740 as a blue EML. Alternatively, the OLED D7 may have a two-stack structure where one of the first emitting part 1520 and the third emitting part 1720 each of which includes the EML1 1540 and the EML3 1740 as a blue EML is omitted.

Example 1 (Ex. 1): Fabrication of OLED

An OLED comprising an EML into which mCBP (LUMO −2.5 eV; HOMO −6.0 eV) as a host, compound 1-1 (LUMO −3.0 eV; HOMO −5.7 eV) in Chemical Formula 2 as delayed fluorescent material (DF) and compound 2-1 (LUMO −3.6 eV; HOMO −5.8 eV) in Chemical Formula 4 as fluorescent material (FD) was introduced was fabricated. ITO substrate was washed by UV-Ozone treatment before using, and was transferred to a vacuum chamber for depositing emission layer. Subsequently, an anode, an emission layer and a cathode were deposited by evaporation from a heating boat under $10^4$ torr vacuum condition with setting deposition rate of 1 Å/s in the following order:

An anode (ITO, 50 nm); a HIL (HAT-CN, 7 nm); a HTL (NPB, 78 nm); an EBL (TAPC, 15 nm), an EML (mCBP: Compound 1-1:Compound 2-1=64:35:1 by weight ratio, 35 nm); a HBL (B3PYMPM, 10 nm); an ETL (TPBi, 25 nm), an EIL (LiF); and a cathode (Al).

And then, cappling layer (CPL) was deposited over the cathode and the device was encapsulated by glass. After deposition of emissive layer and the cathode, the OLED was transferred from the deposition chamber to a dry box for film formation, followed by encapsulation using UV-curable epoxy and moisture getter. The energy level relationships among the luminous materials in the EML are as follows: $LUMO^{FD}-LUMO^{DF}=-0.6$ eV; $HOMO_{FD}-HOMO^{DF}=-0.1$ eV.

Example 2 (Ex. 2): Fabrication of OLED

An OLED was fabricated using the same materials as Example 1, except that compound 1-2 (LUMO −3.1 eV; HOMO −5.7 eV) in Chemical Formula 2 was used as delayed fluorescent material in the EML instead of compound 1-1. $LUMO^{FD}-LUMO^{DF}=-0.5$ eV; $HOMO^{FD}-HOMO^{DF}=-0.1$ eV.

Example 3 (Ex. 3): Fabrication of OLED

An OLED was fabricated using the same materials as Example 1, except that compound 1-17 (LUMO −3.1 eV; HOMO −5.9 eV) in Chemical Formula 2 was used as delayed fluorescent material in the EML instead of compound 1-1. $LUMO^{FD}-LUMO^{DF}=-0.5$ eV; $HOMO^{FD}-HOMO^{DF}=0.1$ eV.

Example 4 (Ex. 4): Fabrication of OLED

An OLED was fabricated using the same materials as Example 1, except that compound 1-4 (LUMO −3.1 eV; HOMO −5.7 eV) in Chemical Formula 2 was used as delayed fluorescent material in the EML instead of compound 1-1. $LUMO^{FD}-LUMO^{DF}=-0.5$ eV; $HOMO^{FD}-HOMO^{DF}=0.1$ eV.

Example 5 (Ex. 5): Fabrication of OLED

An OLED was fabricated using the same materials as Example 4, except that compound 2-18 (LUMO −3.6 eV; HOMO −5.7 eV) in Chemical Formula 4 was used as fluorescent material in the EML instead of compound 2-1. $LUMO^{FD}-LUMO^{DF}=-0.5$ eV; $HOMO^{FD}-HOMO^{DF}=0.0$ eV.

Example 6 (Ex. 6): Fabrication of OLED

An OLED was fabricated using the same materials as Example 4, except that compound 2-12 (LUMO −3.5 eV;

HOMO −5.7 eV) in Chemical Formula 4 was used as fluorescent material in the EML instead of compound 2-1. $LUMO^{FD}$-$LUMO^{DF}$=−0.4 eV; $HOMO^{FD}$-$HOMO^{DF}$=0.0 eV.

Comparative Example 1 (Ref. 1): Fabrication of OLED

An OLED was fabricated using the same materials as Ex. 1, except that Ref. 1 compound below (LUMO −2.8 eV; HOMO −5.7 eV) in which phenylene linker between an electron donor and an electron acceptor is not substituted was used as delayed fluorescent material in the EML instead of compound 1-1. $LUMO^{FD}$-$LUMO^{DF}$=−0.8 eV; $HOMO^{FD}$-$HOMO^{DF}$=−0.1 eV.

Comparative Example 2 (Ref. 2): Fabrication of OLED

An OLED was fabricated using the same materials as Ex. 1, except that Ref. 2 compound below (LUMO −2.9 eV; HOMO −5.8 eV) in which phenylene linker between an electron donor and an electron acceptor is not substituted was used as delayed fluorescent material in the EML instead of compound 1-1. $LUMO^{FD}$-$LUMO^{DF}$=−0.7 eV; $HOMO^{FD}$-$HOMO^{DF}$=0.0 eV.

Comparative Example 3 (Ref. 3): Fabrication of OLED

An OLED was fabricated using the same materials as Ex. 1, except that Ref. 3 compound below (LUMO −2.9 eV; HOMO −5.9 eV) in which phenylene linker between an electron donor and an electron acceptor is not substituted was used as delayed fluorescent material in the EML instead of compound 1-1. $LUMO^{FD}$-$LUMO^{DF}$=−0.7 eV; $HOMO^{FD}$-$HOMO^{DF}$=0.1 eV.

Comparative Example 4 (Ref. 4): Fabrication of OLED

An OLED was fabricated using the same materials as Ex. 1, except that Ref. 4 compound below (LUMO −2.9 eV; HOMO −5.8 eV) in which phenylene linker between an electron donor and an electron acceptor is not substituted was used as delayed fluorescent material in the EML instead of compound 1-1. $LUMO^{FD}$-$LUMO^{DF}$=−0.7 eV; $HOMO^{FD}$-$HOMO^{DF}$=0.0 eV.

Ref. 1

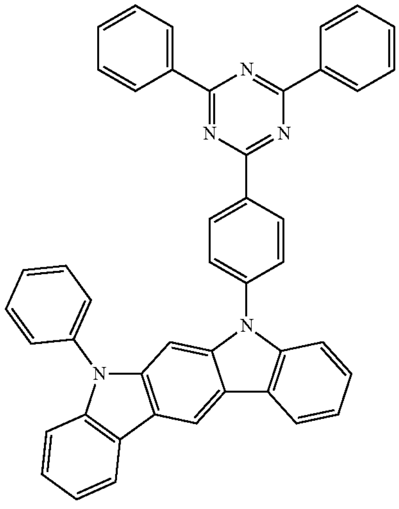

-continued

Ref. 2

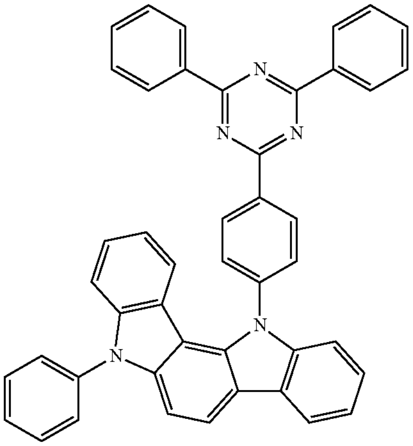

Ref. 3

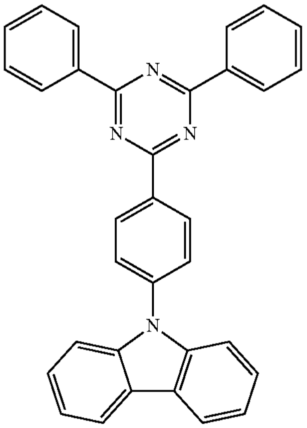

Ref. 4

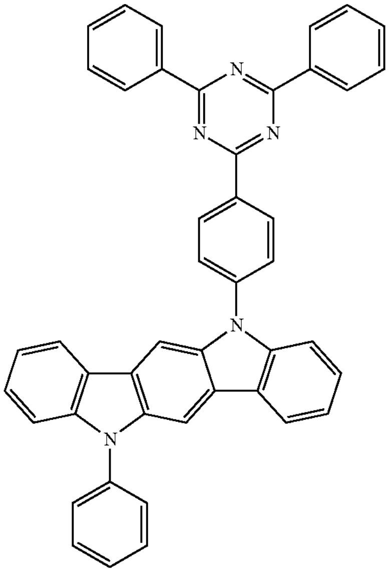

Experimental Example 1: Measurement of Luminous Properties of OLED

Each of the OLED fabricated by Ex. 1-10 and Ref. 1-15 was connected to an external power source and then luminous properties for all the diodes were evaluated using a constant current source (KEITHLEY) and a photometer PR650 at room temperature. In particular, driving voltage (V), current efficiency (cd/A), power efficiency (lm/W) and external quantum efficiency (EQE, %) at 6.3 mA/$m^2$ current density were measured. The results thereof are shown in the following Table 1.

TABLE 1

| Luminous Properties of OLED | | | | |
|---|---|---|---|---|
| Sample | V | cd/A | lm/W | EQE (%) |
| Ref. 1 | 5.0 | 15 | 16 | 7.0 |
| Ref. 2 | 5.0 | 18 | 17 | 7.3 |
| Ref. 3 | 4.8 | 10 | 8 | 4.1 |
| Ref. 4 | 4.7 | 9 | 8 | 4.2 |
| Ex. 1 | 4.0 | 54 | 42 | 15.7 |
| Ex. 2 | 4.2 | 57 | 43 | 16.7 |
| Ex. 3 | 4.1 | 56 | 47 | 17.4 |
| Ex. 4 | 4.1 | 60 | 49 | 17.8 |
| Ex. 5 | 4.2 | 59 | 44 | 17.0 |
| Ex. 6 | 4.0 | 62 | 48 | 17.5 |

As indicated in Table 1, compared to the OLEDs which were designed to have LUMO energy level bandgap between the delayed fluorescent material and the fluorescent material more than 0.6 eV in Ref 1 to 4, the OLEDs which were designed to have LUMO energy level bandgap between the delayed fluorescent material and the fluorescent material satisfying the relationship in Equation (1) in Ex. 1-6 lowered their driving voltage up to 20.0% and improved their current efficiency, power efficiency and EQE up to 566.7%, 512.5 and 334.1%, respectively.

It will be apparent to those skilled in the art that various modifications and variations can be made in the OLED and the organic light emitting device including the OLED of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light emitting diode, comprising:

a first electrode;

a second electrode facing the first electrode; and an emitting material layer disposed between the first and second electrodes, the emitting material layer comprising:

a first compound, a second compound comprising an organic compound having a structure represented by Chemical Formula 1, and a third compound, wherein the Chemical Formula 1 is:

[Chemical Formula 1]

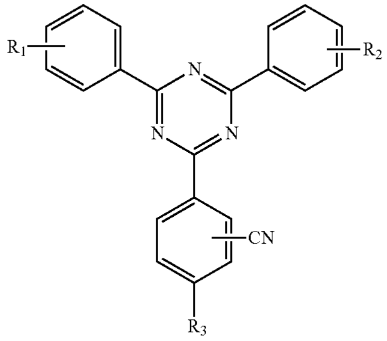

wherein:

each of $R_1$ and $R_2$ is independently hydrogen or an unsubstituted or substituted $C_1$-$C_{10}$ alkyl group; and $R_3$ is a phenoxazinyl moiety with a dibenzo-furan ring or a dibenzo-thiophene ring fused thereto,

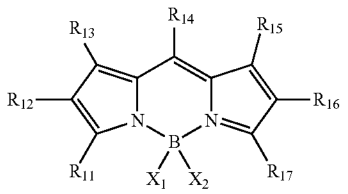

wherein the third compound includes at least one selected from the group consisting of:

2-23

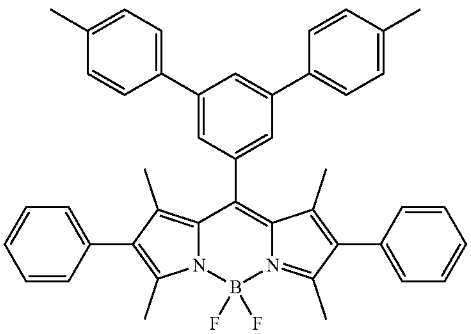

2-24

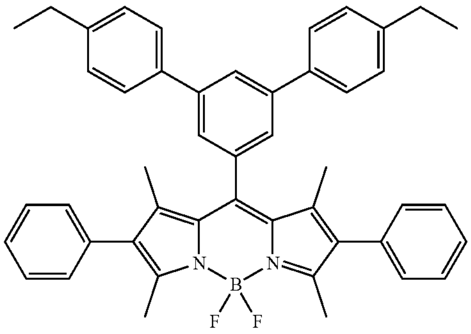

-continued 2-25

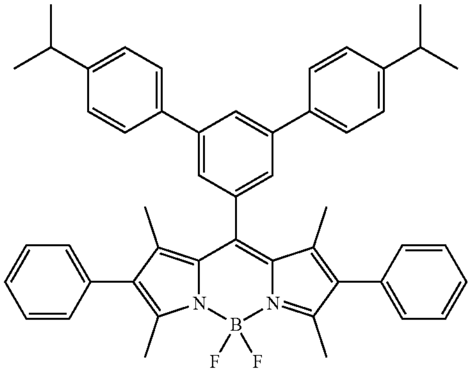

2-26

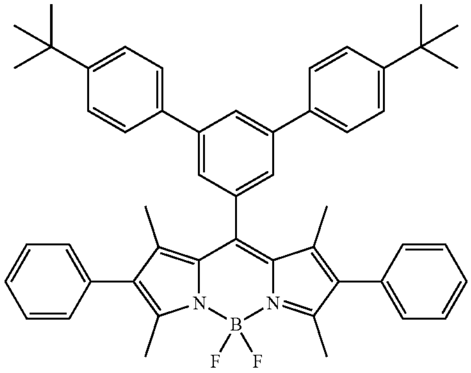, and wherein the first compound includes at least one selected from the group consisting of Bis [2-(diphenylphosphino)phenyl] ether oxide (DPEPO), 2,8-bis(diphenylphosphoryl)dibenzothiophene (PPT), 4'-(9H-carbazol-9-yl)biphenyl-3,5-dicarbonitrile (pCzB-2CN), 3'-(9H-carbazol-9- yl) biphenyl-3,5-dicarbonitrile (mCzB-2CN), Diphenyl-4-triphenylsilylphenyl-phosphine oxide (TSPO1), and 4-(3-(triphenylen-2-yl) phenyl)dibenzo [b,d] thiophene.

2. The organic light emitting diode of claim 1, wherein a LUMO (Lowest Unoccupied Molecular Orbital) energy level ($LUMO^{DF}$) of the second compound and a LUMO energy level ($LUMO^{FD}$) of the third compound satisfy the following relationship in Equation (1):

$$-0.6\ eV \leq LUMO^{FD} - LUMO^{DF} \leq 0.1\ eV \quad (1).$$

3. The organic light emitting diode of claim 1, wherein a HOMO (Highest Occupied Molecular Orbital) energy level ($HOMO^{DF}$) of the second compound and a HOMO energy level ($HOMO^{FD}$) of the third compound satisfy the following relationship in Equation (2):

$$-0.3\ eV \leq HOMO^{DF} - HOMO^{FD} \leq 0.3\ eV \quad (2).$$

4. The organic light emitting diode of claim 1, wherein an excited singlet energy level of the first compound is higher than an excited singlet energy level of the second compound and an excited triplet energy level of the first compound is higher than an excited triplet energy level of the second compound.

5. An organic light emitting diode comprising:

a first electrode;

a second electrode facing the first electrode;

a first emitting material layer disposed between the first and second electrodes, the first emitting material layer comprising:

a first compound; and a second compound that comprises an organic compound having a structure represented by Chemical Formula 1;

a second emitting material layer disposed between the first electrode and the first emitting material layer or between the first emitting material layer and the second electrode, the second emitting material layer comprising:

a fourth compound; and a fifth compound; and a charge generation layer disposed between the first emitting material layer and the second emitting material layer, wherein the Chemical Formula 1 is:

[Chemical Formula 1]

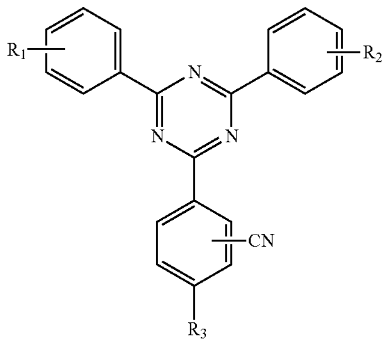

wherein:

each of $R_1$ and $R_2$ is independently hydrogen or an unsubstituted or substituted $C_1$-$C_{10}$ alkyl group; and $R_3$ is phenoxazinyl moiety with a dibenzo-furan ring or a dibenzo-thiophene ring fused thereto, wherein the fifth compound includes at least one selected from the group consisting of:

2-23

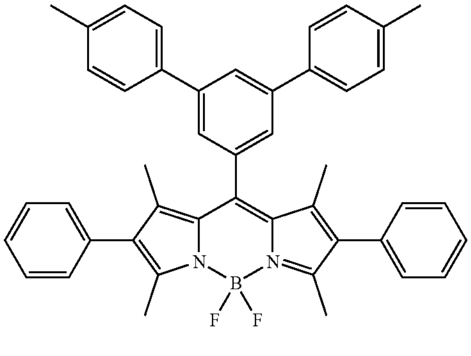

-continued 2-24

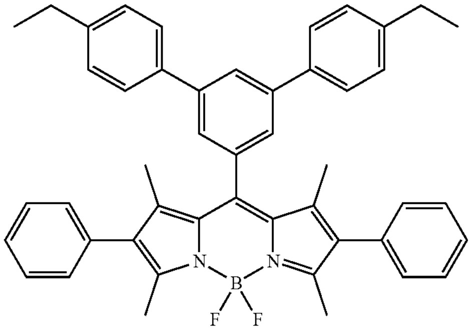

2-25

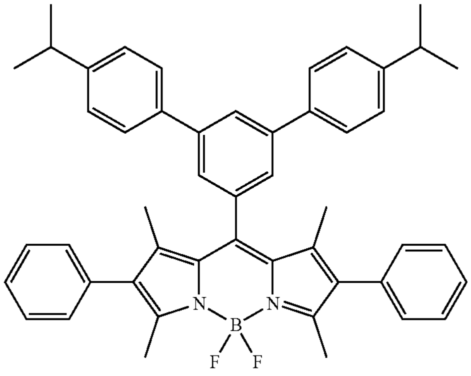

2-26

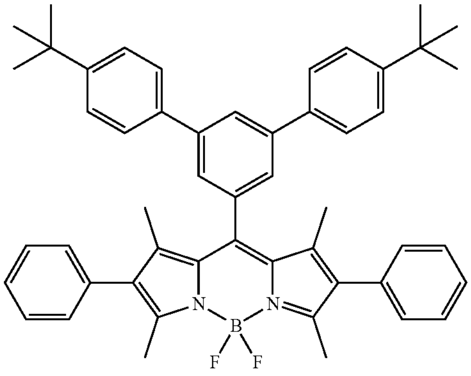, and wherein the first compound includes at least one selected from the group consisting Bis[2-(diphenylphosphino)phenyl] ether oxide (DPEPO), 2,8-bis (diphenylphosphoryl)dibenzothiophene (PPT),4'-(9H-carbazol-9-yl) biphenyl-3,5-dicarbonitrile (pCzB-2CN), 3'-(9H-carbazol-9-yl)biphenyl-3,5-dicarbonitrile (mCzB-2CN), Diphenyl-4-triphenylsilylphenyl-phosphine oxide (TSPO1), and 4-(3-(triphenylen-2-yl) phenyl)dibenzo [b,d] thiophene.

6. The organic light emitting diode of claim 5, wherein a LUMO (Lowest Unoccupied Molecular Orbital) energy level ($LUMO^{DF}$) of the second compound and a LUMO energy level ($LUMO^{FD}$) of the third compound satisfy the following relationship in Equation (1):

$$-0.6\ eV \le LUMO^{FD} - LUMO^{DF} \le 0.1\ eV \quad (1).$$

7. The organic light emitting diode of claim 5, wherein a HOMO (Highest Occupied Molecular Orbital) energy level ($HOMO^{DF}$) of the second compound and a HOMO energy level ($HOMO^{FD}$) of the third compound satisfy the following relationship in Equation (2):

$$-0.3\ eV \le HOMO^{DF} - HOMO^{FD} \le 0.3\ eV \quad (2).$$

8. The organic light emitting diode of claim 5, wherein an excited singlet energy level of the first compound is higher than an excited singlet energy level of the second compound and an excited triplet energy level of the first compound is higher than an excited triplet energy level of the second compound.

9. The organic light emitting diode of claim 5, wherein an excited singlet energy level of the fourth compound is higher than an excited singlet energy level of the fifth compound.

10. The organic light emitting diode of claim 5, wherein each of excited singlet energy levels and excited triplet energy levels of the first and fourth compounds is higher than each of an excited singlet energy level and an excited triplet energy level of the second compound, respectively.

11. The organic light emitting diode of claim 5, further comprising a third emitting material layer, wherein the first emitting material layer is between the second emitting material layer and the third emitting material layer.

12. The organic light emitting diode of claim 11, wherein the third emitting material layer comprises a sixth compound and a seventh compound, and wherein the seventh compound comprises any organic compound selected from the group consisting of:

2-23

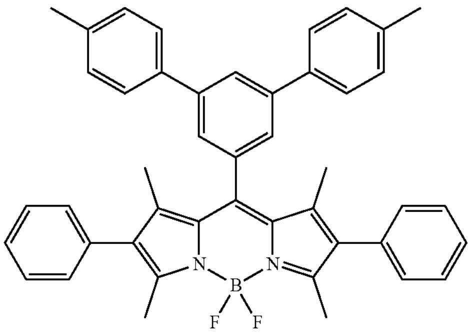

2-24

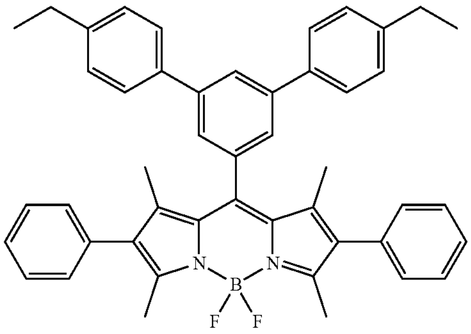

-continued 2-25

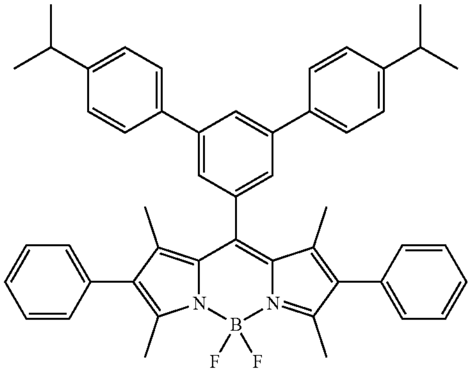

2-26

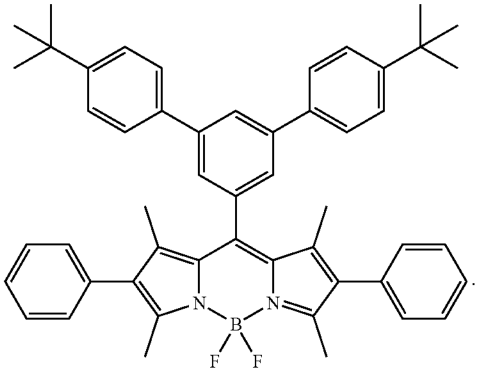

13. The organic light emitting diode of claim 12, wherein each of excited singlet energy levels and excited triplet energy levels of the first, fourth and sixth compounds is higher than each of an excited singlet energy level and an excited triplet energy level of the second compound, respectively.

14. The organic light emitting diode of claim 13, wherein an excited singlet energy level of the sixth compound is higher than an excited singlet energy level of the seventh compound.

15. An organic light emitting device comprising:

a substrate; and an organic light emitting diode of claim 1 over the substrate.

16. An organic light emitting device comprising:

a substrate; and an organic light emitting diode of claim 5 over the substrate.

17. The organic light emitting diode of claim 1, wherein a LUMO (Lowest Unoccupied Molecular Orbital) energy level ($LUMO^{DF}$) of the second compound and a LUMO energy level ($LUMO^{FD}$) of the third compound satisfy the following relationship in Equation (3):

$$-0.6\ eV \leq LUMO^{FD} - LUMO^{DF} \leq -0.3\ eV \quad (3).$$

18. The organic light emitting diode of claim 1, wherein a HOMO (Highest Occupied Molecular Orbital) energy level ($HOMO^{DF}$) of the second compound and a HOMO energy level ($HOMO^{FD}$) of the third compound satisfy the following relationship in Equation (4):

$$-0.2\ eV \leq HOMO^{DF} - HOMO^{FD} \leq 0.2\ eV \quad (4).$$

19. The organic light emitting diode of claim 1, wherein an energy level bandgap between an excited singlet energy level and an excited triplet energy level of the second compound is equal to or less than about 0.3 eV.

20. The organic light emitting diode of claim 1, wherein an excited singlet energy level of the second compound is higher than an excited singlet energy level of the third compound.

21. The organic light emitting diode of claim 1, wherein an excited triplet energy level of the second compound is higher than an excited triplet energy level of the third compound.

22. The organic light emitting diode of claim 1, wherein contents of the first compound is larger than contents of the second compound in the emitting material layer.

23. The organic light emitting diode of claim 1, wherein contents of the second compound is larger than contents of the third compound in the emitting material layer.

24. The organic light emitting diode of claim 1, wherein the third compound includes:

2-23

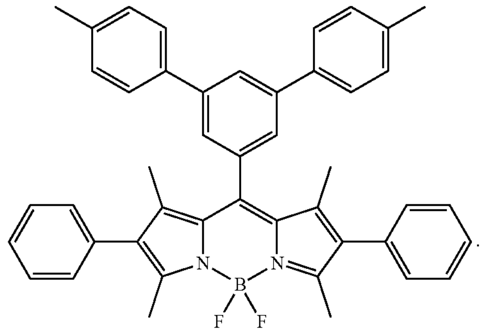

25. The organic light emitting diode of claim 1, wherein the third compound includes:

2-24

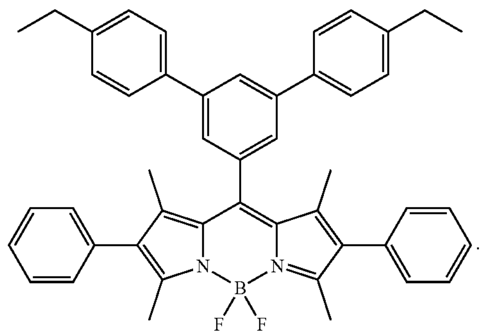

26. The organic light emitting diode of claim 1, wherein the third compound includes one compound selected from the group consisting of:

2-25
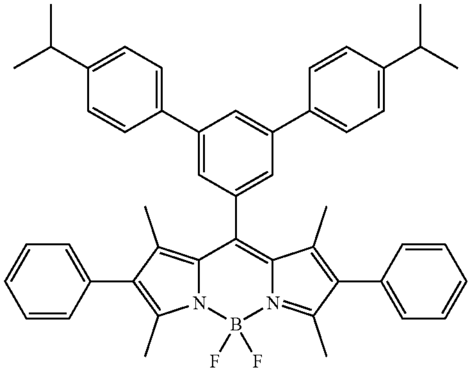
2-26
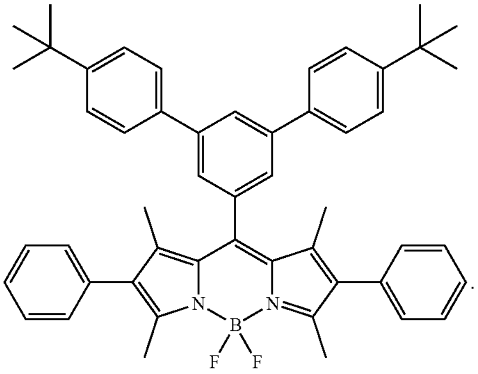
.
* * * * *